US007122457B2

(12) United States Patent
Tanida et al.

(10) Patent No.: US 7,122,457 B2
(45) Date of Patent: Oct. 17, 2006

(54) SEMICONDUCTOR CHIP PRODUCTION METHOD, SEMICONDUCTOR DEVICE PRODUCTION METHOD, SEMICONDUCTOR CHIP, AND SEMICONDUCTOR DEVICE

(75) Inventors: Kazumasa Tanida, Kyoto (JP); Yoshihiko Nemoto, Tokyo (JP); Naotaka Tanaka, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 251 days.

(21) Appl. No.: 10/840,677

(22) Filed: May 7, 2004

(65) Prior Publication Data
US 2005/0009329 A1 Jan. 13, 2005

(30) Foreign Application Priority Data
May 13, 2003 (JP) ............................. 2003-134810

(51) Int. Cl.
*H01L 21/44* (2006.01)
(52) U.S. Cl. ...................... 438/612; 438/620; 438/667
(58) Field of Classification Search ................ 438/612, 438/618, 620, 667
See application file for complete search history.

(56) References Cited

U.S. PATENT DOCUMENTS

| | | | | |
|---|---|---|---|---|
| 5,229,647 A | * | 7/1993 | Gnadinger | ................ 257/785 |
| 5,627,106 A | * | 5/1997 | Hsu | ......................... 438/459 |
| 6,841,883 B1 | * | 1/2005 | Farnworth et al. | .......... 257/777 |

FOREIGN PATENT DOCUMENTS

WO    WO 98/19337    5/1998

* cited by examiner

*Primary Examiner*—Michael Trinh
(74) *Attorney, Agent, or Firm*—Rabin & Berdo, PC

(57) ABSTRACT

A semiconductor chip production method including the steps of: forming a front side recess in a semiconductor substrate; depositing a metal material in the front side recess to form a front side electrode electrically connected to a functional device formed on the front surface; removing a rear surface portion of the semiconductor substrate to reduce the thickness of the semiconductor substrate to a thickness greater than the depth of the front side recess; forming a rear side recess communicating with the front side recess in the rear surface of the semiconductor substrate after the thickness reducing step; and depositing a metal material in the rear side recess to form a rear side electrode electrically connected to the front side electrode for formation of a through-electrode.

8 Claims, 22 Drawing Sheets

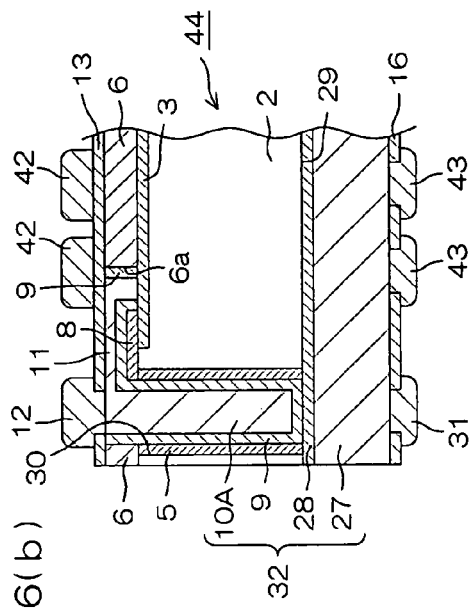
FIG. 6(a)
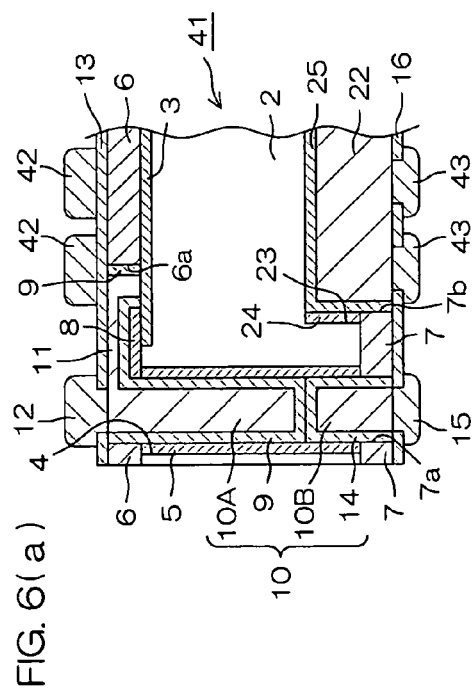
FIG. 6(b)
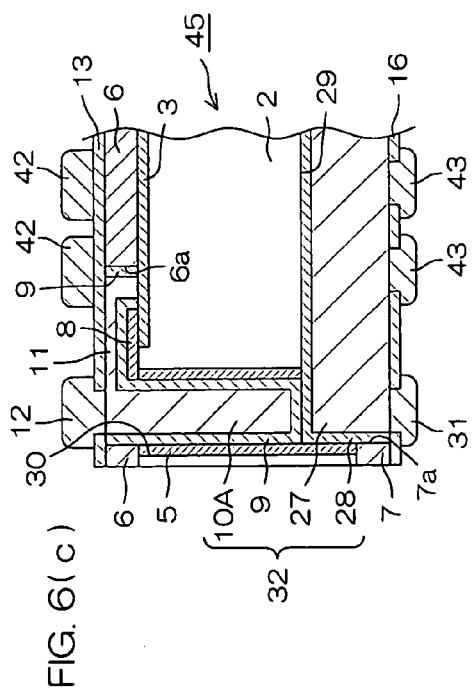
FIG. 6(c)
FIG. 6(d)

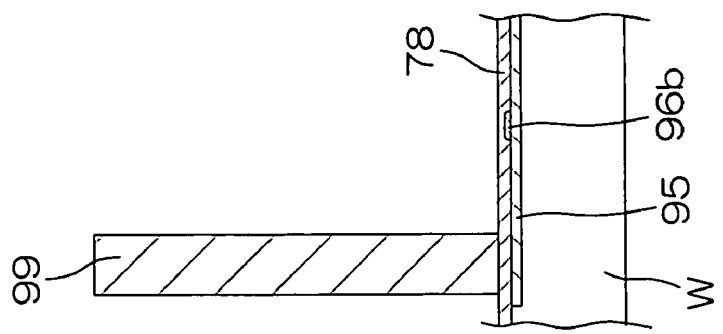
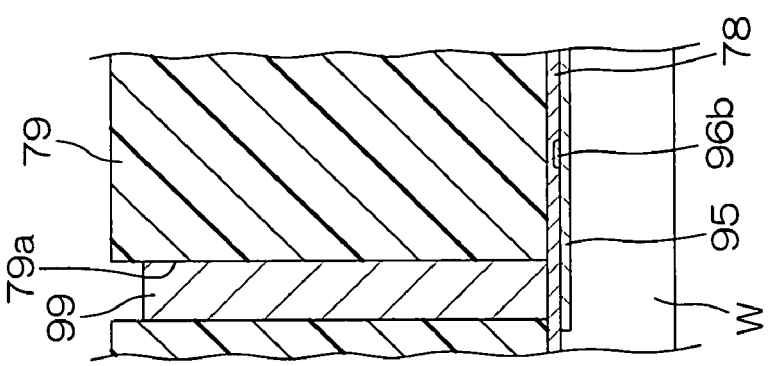
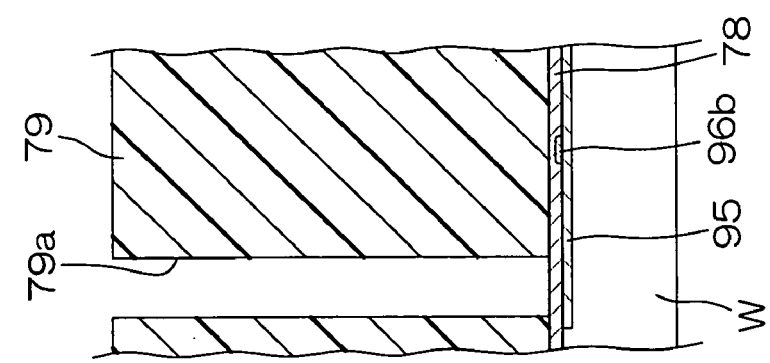
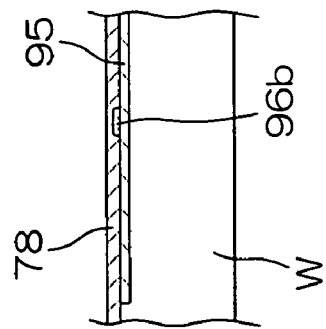

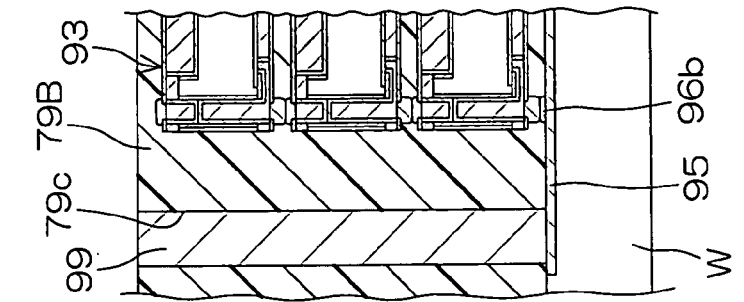
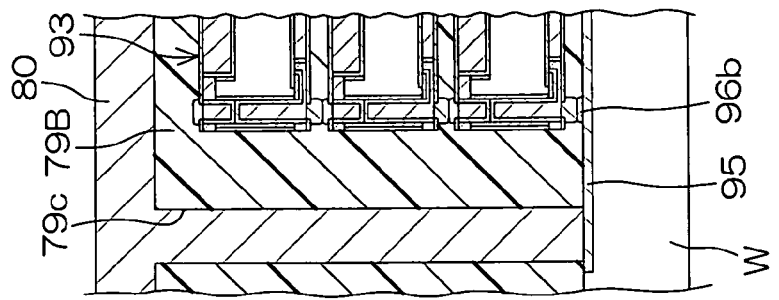
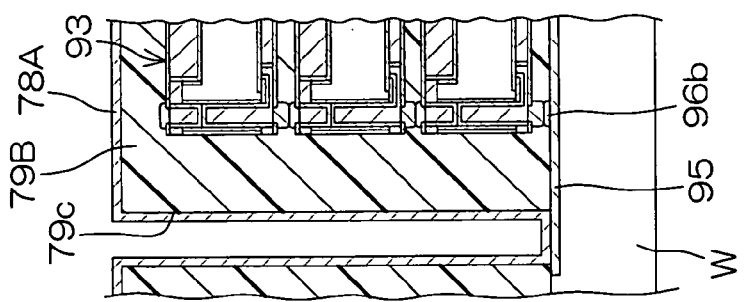
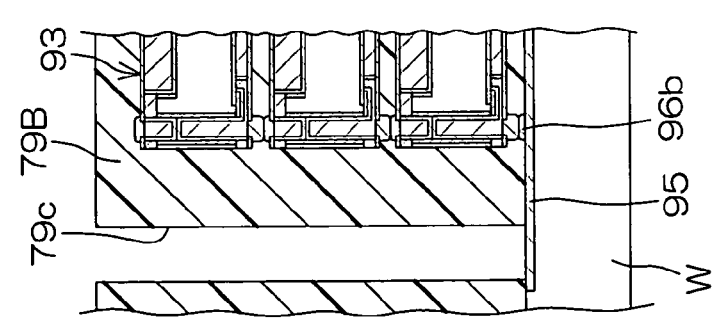
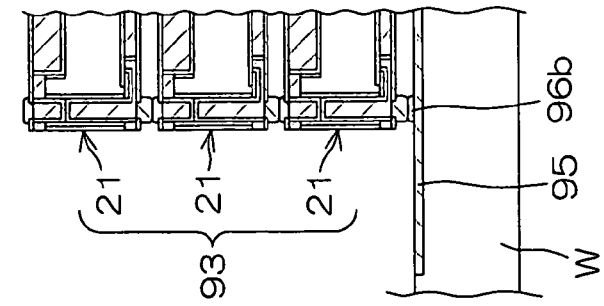

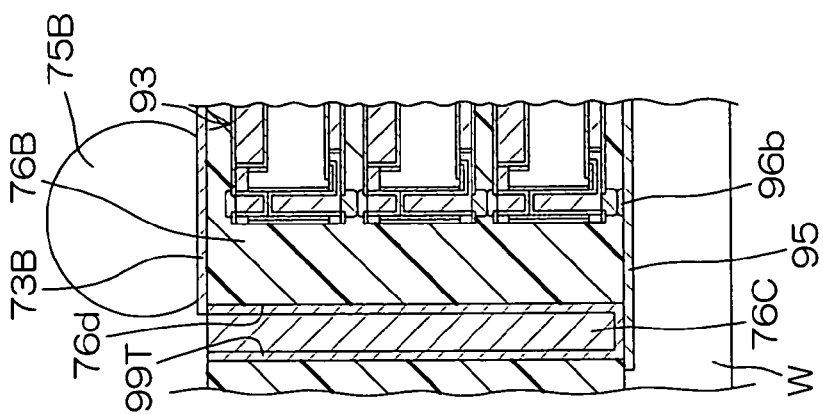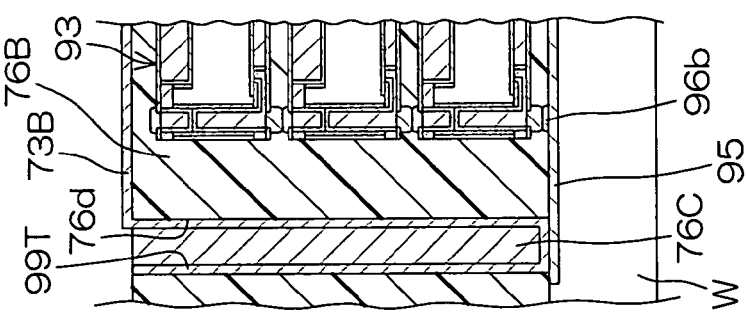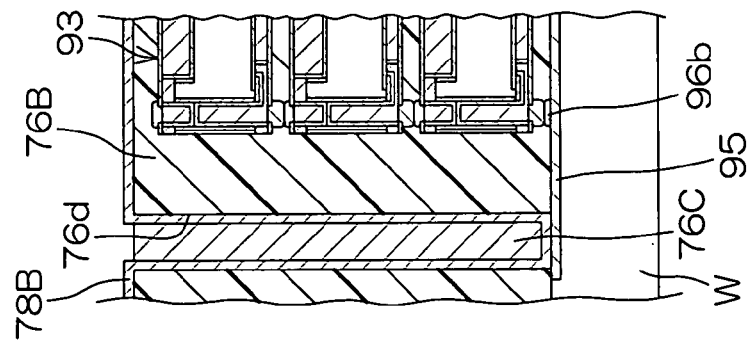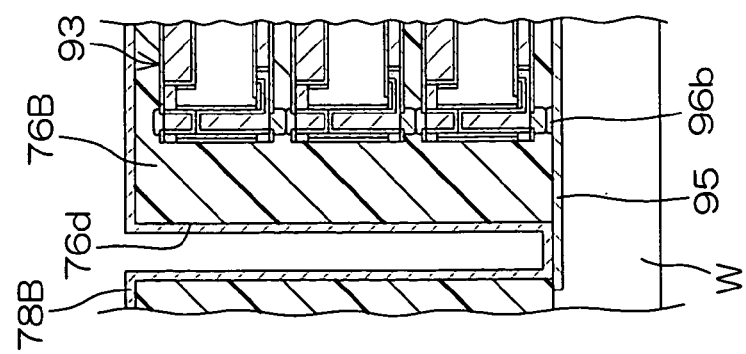

SEMICONDUCTOR CHIP PRODUCTION METHOD, SEMICONDUCTOR DEVICE PRODUCTION METHOD, SEMICONDUCTOR CHIP, AND SEMICONDUCTOR DEVICE

BACKGROUND OF THE INVENTION

1. Field of the Invention

The present invention relates to a semiconductor chip having a through-electrode extending thicknesswise therethrough and a production method for the semiconductor chip, and to a semiconductor device including a plurality of semiconductor chips stacked one on another and each having a through-electrode extending thicknesswise therethrough and a production method for the semiconductor device.

2. Description of Related Art

A multichip module (MCM) is conventionally known as a semiconductor device which includes a plurality of semiconductor chips. In the conventional multichip module, the plurality of semiconductor chips are arranged on an insulative wiring board horizontally parallel to the wiring board. In this case, the multichip module has a greater footprint, i.e., takes a greater area when the multichip module is mounted on a second wiring board.

In this connection, an attempt is made to reduce the footprint of a semiconductor device by stacking a plurality of semiconductor chips on a wiring board in the semiconductor device. In this semiconductor device, the semiconductor chips each include a through-electrode extending thicknesswise therethrough, and vertical electrical connection of the semiconductor chips is typically achieved via the through-electrodes of the respective semiconductor chips.

FIGS. 17(a) to 17(f) are schematic sectional views for explaining a first conventional method for producing semiconductor chips each having a through-electrode.

A hard mask 103 of silicon oxide ($SiO_2$) is formed on one surface (hereinafter referred to as "front surface") of a semiconductor wafer (hereinafter referred to simply as "wafer") W provided with functional devices 101. The hard mask 103 has openings 103a which each expose a predetermined portion of the functional device 101 and a portion of the wafer W on a lateral side of the functional device 101.

Where the wafer W has a diameter of 8 inches, the wafer W has a thickness of about 725 μm. Where the wafer W has a diameter of 6 inches, the wafer W has a thickness of about 625 μm.

In turn, front side recesses 102 are each formed in the portion of the wafer W exposed in the opening 103a on the lateral side of the functional device 101 by reactive ion etching (RIE). The front side recesses 102 each have a depth of about 70 μm, for example. Then, insulation films 104 of silicon oxide each having a pattern which exposes the predetermined portion of the functional device 101 are formed on exposed interior surfaces of the openings 103a and the front side recesses 102 by a CVD (chemical vapor deposition) method.

After seed layers 105 such as of copper are formed on the insulation films 104 and on the inner peripheral surfaces of the openings 103a, a metal material 106 of copper is deposited in the openings 103a and the front side recesses 102 by a plating process employing the seed layers 105 as a seed. The metal material 106 is electrically connected to the predetermined portions of the functional devices 101.

Subsequently, the front surface of the resulting wafer W, i.e., the surface of the wafer W provided with the metal material 106, is polished (ground) by a CMP (chemical mechanical polishing) method, whereby the surface of the hard mask 103 becomes flush with the surfaces of the resulting metal material portions 106. In turn, a front side insulation film 107 having openings which each expose the surface of the metal material portion 106 above the front side recess 102 is formed on the front surface of the resulting wafer W, and bumps 108 are each formed on the exposed surface of the metal material portion 106 as shown in FIG. 17(a).

In turn, a base not shown is bonded onto the front surface of the resulting wafer W, and a surface (hereinafter referred to as "rear surface") of the wafer W opposite from the front surface is mechanically polished, whereby the thickness of the wafer W is reduced to about 55 μm. Thus, the metal material portions 106 are exposed to the rear surface of the wafer W. A part of the metal material portion 106 in the front side recess 102 serves as a through-electrode 109. The other part of the metal material portion 106 serves as an interconnection member 110 which electrically connects the through-electrode 109 to the functional device 101 as shown in FIG. 17(b).

A polishing-damage layer having polishing marks and damaged by the polishing is present in the rear surface of the wafer W. For removal of the polishing-damage layer, the rear surface of the wafer W is dry-etched by about 5 μm. At this time, the through-electrodes 109, the seed layers 105 and the insulation films 104 are barely etched thereby to project from the rear surface of the wafer W as shown in FIG. 17(c). After this step, the resulting wafer W has a thickness of about 50 μm.

Subsequently, a rear side insulation film 111 of silicon oxide is formed over the rear surface of the wafer W (see FIG. 17(d)), and portions of the rear side insulation film 111 covering the through-electrodes 109, the seed layers 105 and the insulation films 104 are polished away, whereby the through-electrodes 109, the seed layers 105 and the insulation films 104 are exposed (see FIG. 17(e)). Then, bumps 112 are each formed on the exposed surface of the through-electrode 109 and the seed layer 105 on the rear surface of the wafer W (see FIG. 17(f)). Thereafter, the wafer W is diced to provide the semiconductor chips each having the through-electrode 109.

FIGS. 18(a) to 18(f) are schematic sectional views for explaining a second conventional method for producing semiconductor chips each having a through-electrode. This production method is disclosed in International Publication Pamphlet WO98/19337. In FIGS. 18(a) to 18(f), components corresponding to those shown in FIGS. 17(a) to 17(f) are denoted by the same reference characters as in FIGS. 17(a) to 17(f), and no explanation will be given thereto.

First, the step of forming the bumps 108 on the front surface of the wafer W and the steps precedent thereto are performed in the same manner as in the first conventional production method (see FIG. 18(a)). The front side recesses 102 each have a depth of about 70 μm as in the first conventional production method. In turn, the rear surface of the wafer W is mechanically polished, whereby the thickness of the wafer W is reduced to about 80 μm. Therefore, the front side recesses 102 do not penetrate through the wafer W at this stage, so that about 10-μm thick wafer portions are present between the metal material portions 106 in the front side recesses 102 and the rear surface of the wafer W as shown in FIG. 18(b).

Then, the rear surface of the wafer W is dry-etched by about 30 μm. This step is performed in such a manner that the insulation films 104 are etched at a lower etching rate than the wafer W. Thus, the polishing-damage layer is removed, and the metal material portions 106 each covered with the seed layer 105 and the insulation film 104 project by about 20 μm from the rear surface of the wafer W as shown in FIG. 18(c).

In turn, an insulation film 115 of silicon oxide is formed over the rear surface of the wafer W (see FIG. 18(d)), and the insulation films 115, 104 and the seed layers 105 are partly removed from the rear surface of the wafer W, whereby the metal material portions 106 are exposed to the rear surface of the wafer W. Thus, a part of the metal material portion 106 in the front side recess 102 serves as a through-electrode 117, and the other part of the metal material portion 106 serves as an interconnection member 118 which electrically connects the through-electrode 117 to the functional device 101 as shown in FIG. 18(e).

Subsequently, bumps 116 are each formed on the exposed surface of the through-electrode 117 and the seed layer 105 on the rear surface of the wafer W. Thereafter, the wafer W is diced to provide the semiconductor chips each having the through-electrode 117.

The semiconductor chips produced by either of the aforesaid production methods are vertically stacked with the bump 108 of one of each adjacent pair of the semiconductor chips being connected to the bump 112 or 116 of the other semiconductor chip, whereby the semiconductor chips are electrically connected to one another. Thus, the interconnection length can be reduced. The semiconductor device has a reduced footprint on a wiring board or the like.

In the first conventional production method, the through-electrodes 109 (metal material portions 106) are partly polished together with the wafer W when the rear surface of the wafer W is polished (see FIG. 17(b)). This results in contamination of the wafer W with copper of the metal material 106, thereby deteriorating the characteristics of the semiconductor chips. The copper is diffused to a great depth of the wafer W, and remains in the wafer W even after the removal of the polishing-damage layer (FIG. 17(c)).

The through-holes (front side recesses 102) are required to have a size (width) of about 10 μm, for example, due to tighter process rules. In this case, however, the depth of the front side recesses 102 cannot be increased to about 70 μm or greater. Therefore, the thickness of the wafer W should be reduced to 70 μm or smaller (to about 50 μm in the aforesaid example) in order to assuredly expose the metal material portions 106 (through-electrodes 109) to the rear surface. Therefore, the resulting semiconductor chips (semiconductor substrates provided by dicing the wafer W) each have a thickness of 70 μm or smaller (about 50 μm in the aforesaid example).

However, where the thickness of the semiconductor chips is reduced to 100 μm or smaller, the rigidity of the semiconductor chips is drastically reduced. When the semiconductor chips each having a smaller thickness are stacked to be assembled into a semiconductor device, the semiconductor chips are liable to warp, so that the semiconductor chips cannot properly be connected to each other or to the wiring board.

In the second production method, the metal material portions 106 (through-electrodes 117) are not exposed when the rear surface of the wafer W is polished for the thickness reduction of the wafer W. Therefore, the wafer W is free from contamination with copper. However, the semiconductor chips produced by the second method each have a reduced rigidity like those produced by the first method, because the thickness of the wafer W is finally reduced to 70 μm or smaller (to about 50 μm in the aforesaid example).

Therefore, inconvenience occurs in assembling the semiconductor chips into a semiconductor device.

SUMMARY OF THE INVENTION

It is an object of the present invention to provide a semiconductor chip which includes a through-electrode and is less susceptible to metal contamination.

It is another object of the present invention to provide a semiconductor chip which includes a through-electrode and has a higher rigidity.

It is further another object of the present invention to provide a production method for a semiconductor chip which includes a through-electrode and is less susceptible to metal contamination.

It is still another object of the present invention to provide a production method for a semiconductor chip which includes a through-electrode and has a higher rigidity.

It is further another object of the present invention to provide a semiconductor device including semiconductor chips which each include a through-electrode and are less susceptible to metal contamination.

It is still another object of the present invention to provide a semiconductor device including semiconductor chips which each include a through-electrode and have a higher rigidity.

It is further another object of the present invention to provide a production method for a semiconductor device including semiconductor chips which each include a through-electrode and are less susceptible to metal contamination.

It is still another object of the present invention to provide a production method for a semiconductor device including semiconductor chips which each include a through-electrode and have a higher rigidity.

According to one aspect of the present invention, there is provided a semiconductor chip production method, which comprises the steps of: forming a front side recess in a semiconductor substrate having a front surface and a rear surface and including a functional device provided in the front surface thereof, the front side recess extending from the front surface of the semiconductor substrate along the thickness of the semiconductor substrate; depositing a metal material in the front side recess to form a front side electrode electrically connected to the functional device; removing a rear surface portion of the semiconductor substrate to reduce the thickness of the semiconductor substrate to a predetermined thickness which is greater than the depth of the front side recess; forming a rear side recess communicating with the front side recess in the rear surface of the semiconductor substrate after the thickness reducing step to form a continuous through-hole; and depositing a metal material in the rear side recess to form a rear side electrode electrically connected to the front side electrode for formation of a through-electrode extending through the semiconductor substrate.

According to this inventive aspect, the thickness of the semiconductor substrate is reduced by removing the rear surface portion of the semiconductor substrate in the thickness reducing step. At this time, the semiconductor substrate has the predetermined thickness which is greater than the depth of the front side recess. Hence, the front side recess does not extend through the semiconductor substrate to the rear side of the semiconductor substrate, so that the metal material deposited in the front side recess is not exposed to the rear side of the semiconductor substrate. Even if the rear surface of the semiconductor substrate is physically polished (or ground) in the thickness reducing step, metal atoms of the metal material deposited in the front side recess are not diffused into the semiconductor substrate during the polishing. Therefore, the semiconductor chip has proper characteristics.

There is no need to allow the front side recess to penetrate through the semiconductor substrate in the thickness reducing step, so that the semiconductor substrate has a thickness (e.g., not smaller than 100 μm) which ensures a sufficiently high rigidity after the thickness reducing step.

The thickness reducing step may include the steps of: physically polishing the rear surface of the semiconductor substrate; and, after the polishing step, removing a polishing-damage layer which occurs in the rear surface portion of the semiconductor substrate during the polishing step.

In the polishing step, the polishing-damage layer having polishing marks and damaged by the physical polishing (grinding) of the rear surface of the semiconductor substrate occurs in the rear surface portion of the semiconductor substrate. With the aforesaid arrangement, the polishing-damage layer can be removed. In this case, the thickness of the semiconductor substrate before the removal of the polishing-damage layer is determined so as to allow the semiconductor substrate to have a sufficiently high rigidity after the removal of the polishing-damage layer.

Since the front side recess is allowed to communicate with the rear side of the semiconductor substrate through the rear side recess formed at a predetermined position in the rear surface of the semiconductor substrate, the thickness of the semiconductor substrate of the resulting semiconductor chip is nearly equal to the thickness of the semiconductor substrate after the thickness reducing step. Therefore, the semiconductor chip has a sufficiently high rigidity. Where a semiconductor device is assembled by employing the semiconductor chip, the semiconductor chip can properly be connected to another semiconductor chip or to a wiring board because the semiconductor chip is free from warp.

The production method according to this inventive aspect provides the semiconductor chip which has the through-electrode extending thicknesswise through the semiconductor substrate. The through-electrode makes it possible to electrically connect the front side with the rear side of the semiconductor substrate. Thus, the functional device provided in the front surface of the semiconductor substrate can electrically be connected to the rear side of the semiconductor substrate via a shorter interconnection.

The rear side recess forming step may include the step of forming another rear side recess not communicating with the front side recess. That is, only the rear side recess communicating with the front side recess may be formed, or both the rear side recess communicating with the front side recess and the rear side recess not communicating with the front side recess may be formed in the rear side recess forming step.

The front side electrode formed in the front side electrode forming step may constitute a part of a signal interconnection electrically connected to the functional device, a part of a ground (earth) interconnection electrically connected to the functional device, or a part of a power supply interconnection electrically connected to the functional device. That is, the through-electrode electrically connected to the functional device may constitute a part of the signal interconnection, a part of the ground interconnection, or a part of the power supply interconnection.

The rear side recess forming step may include the step of forming a grounding recess in which the ground interconnection is formed. In this case, the rear side electrode forming step may include the step of depositing the metal material in the grounding recess to form the ground interconnection.

The grounding recess may be formed in a major portion of the rear surface of the semiconductor substrate. Thus, the ground interconnection has a greater area occupying the major portion of the rear surface of the semiconductor substrate, so that heat dissipation from the semiconductor chip through the ground interconnection can be increased.

The grounding recess forming step may comprise the step of forming a grounding recess communicating with the front side recess. In this case, the ground interconnection constitutes a part of the through-electrode to ground the functional device. The grounding recess forming step may comprise the step of forming a grounding recess not communicating with the front side recess. In this case, the through-electrode constitutes a part of the signal interconnection, and the signal interconnection and the ground interconnection are isolated from each other.

The rear side recess forming step may include the step of forming a power supply recess in which the power supply interconnection is formed. In this case, the rear side electrode forming step may include the step of depositing the metal material in the power supply recess to form the power supply interconnection.

With this arrangement, the power supply interconnection electrically connected to the front side electrode can be provided. Therefore, electric power can be supplied to the functional device via the power supply interconnection in the resulting semiconductor chip. The formation of the power supply interconnection is achieved by depositing the metal material in the power supply recess. Therefore, the power supply interconnection is allowed to have a greater thickness (e.g., a thickness of about 30 μm) by forming a deeper power supply recess. Even where the semiconductor chip is an LSI having a multi-layer interconnection, sufficiently great electric power can be supplied to the functional device via the thicker power supply interconnection.

The rear side recess forming step may include the steps of forming a grounding recess, and forming a power supply recess. In this case, the semiconductor chip is produced as having the ground interconnection and the power supply interconnection provided in the rear surface thereof.

The semiconductor chip production method may further comprise the step of exposing a part of the metal material deposited in the rear side recess to an end face of the semiconductor chip.

With this arrangement, the semiconductor chip is produced as having a rear side electrode exposed to the end face thereof. Thus, heat generated in the semiconductor chip can be dissipated from the end face of the semiconductor chip via the rear side electrode, so that the heat dissipation can be increased.

In the aforesaid case, the rear side recess may be used for formation of the rear side electrode which constitutes a part of the signal interconnection. Thus, the semiconductor chip can be produced as having the signal interconnection which is partly exposed to the end face thereof. Alternatively, the rear side recess may be the grounding recess. In this case, the semiconductor chip can be produced as having the ground interconnection which is exposed to the end face thereof.

Further, the rear side recess maybe the power supply recess. In this case, the semiconductor chip can be produced as having the power supply interconnection which is exposed to the end face thereof. Thus, electric power can be supplied to the functional device via the power supply interconnection exposed to the end face. In addition, where semiconductor chips each having such a construction are stacked, a driving voltage can stably be applied to the semiconductor chips (functional devices of the semiconductor chips) by grounding the semiconductor chips via the ground interconnections exposed to the end faces of the semiconductor chips.

At least one of the front side electrode forming step and the rear side electrode forming step may include the steps of forming a seed layer on an interior surface of the recess, and depositing the metal material in the recess by a plating process employing the seed layer as a seed to form the electrode.

This method makes it possible to properly fill the metal material in the front side recess or the rear side recess with higher productivity.

The production method may further comprise the step of removing a portion of the metal material deposited as projecting from the front surface or the rear surface of the semiconductor substrate by a CMP method or the like after the front side electrode forming step or the rear side electrode forming step.

The front side electrode forming step and the rear side electrode forming step are not necessarily required to employ the plating process, but may each comprise the step of depositing the metal material in the front side recess or the rear side recess by a CVD method, a sputtering method, or a dipping method employing a molten material.

According to another aspect of the present invention, there is provided a semiconductor device production method, which comprises the steps of producing each of plural semiconductor chips; and stacking the plural semiconductor chips one on another. The semiconductor chip producing step comprises the steps of: forming a front side recess in a semiconductor substrate having a front surface and a rear surface and including a functional device provided in the front surface thereof, the front side recess extending from the front surface of the semiconductor substrate along the thickness of the semiconductor substrate; depositing a metal material in the front side recess to form a front side electrode electrically connected to the functional device; removing a rear surface portion of the semiconductor substrate to reduce the thickness of the semiconductor substrate to a predetermined thickness which is greater than the depth of the front side recess; forming a rear side recess communicating with the front side recess in the rear surface of the semiconductor substrate after the thickness reducing step to form a continuous through-hole; and depositing a metal material in the rear side recess to form a rear side electrode electrically connected to the front side electrode for formation of a through-electrode extending through the semiconductor substrate.

According to this inventive aspect, the plural semiconductor chips can each be produced as having a greater thickness (e.g., 100 μm or greater) and a sufficiently high rigidity in the semiconductor chip producing step. When these semiconductor chips are stacked one on another, the semiconductor chips can properly be connected to one another, because the semiconductor chips are free from warp.

The semiconductor chip stacking step may include the step of stacking the plural semiconductor chips on a wiring board. Thus, the semiconductor device can be produced as having the plural semiconductor chips stacked on the wiring board. In this case, the semiconductor device is mounted on a second wiring board with the wiring board thereof being disposed generally parallel to the second wiring board. Therefore, the semiconductor chips are arranged perpendicularly to the second wiring board, so that the semiconductor device has a smaller footprint. The semiconductor chips can electrically be connected to one another or to the wiring board of the semiconductor device via a shorter conductive path defined by the through-electrodes extending thicknesswise through the semiconductor chips.

The semiconductor chips produced in the semiconductor chip producing step are less susceptible to metal contamination. By this semiconductor device production method, therefore, the semiconductor device can be produced as including the semiconductor chips each having the through-electrode and less susceptible to metal contamination.

The semiconductor chip producing step may further include the step of forming a bump electrically connected to the through-electrode on at least one of the front and rear surfaces of the semiconductor substrate. In this case, the semiconductor chip stacking step may include the step of connecting the bump formed on one of the semiconductor chips to the bump formed on another of the semiconductor chips.

According to further another aspect of the present invention, there is provided a semiconductor chip, which comprises a semiconductor substrate having a front surface and a rear surface; a functional device provided in the front surface of the semiconductor substrate; and a through-electrode electrically connected to the functional device and provided in a through-hole disposed on a lateral side of the functional device as extending thicknesswise through the semiconductor substrate, the through-electrode electrically connecting a front side and a rear side of the semiconductor substrate; wherein the through-electrode comprises a seed layer having a portion disposed in a depthwise middle portion of the through-hole as closing the through-hole, a front side electrode disposed on a side of the through-hole closing portion of the seed layer closer to the front surface in the through-hole, and a rear side electrode disposed on a side of the through-hole closing portion of the seed layer closer to the rear surface in the through-hole.

According to still another aspect of the present invention, there is provided a semiconductor chip, which comprises: a semiconductor substrate having a front surface and a rear surface; a functional device provided in the front surface of the semiconductor substrate; and a through-electrode electrically connected to the functional device and provided in a through-hole disposed on a lateral side of the functional device as extending thicknesswise through the semiconductor substrate, the through-electrode electrically connecting a front side and a rear side of the semiconductor substrate; wherein the through-electrode includes a front side electrode disposed in a front side recess which is provided in the front surface of the semiconductor substrate and partly constitutes the through-hole, and a rear side electrode disposed in a rear side recess which is provided in the rear surface of the semiconductor substrate in communication with the front side recess and partly constitutes the through-hole; wherein the rear side recess occupies a major area of the rear surface including an area associated with a front side portion provided with the front side electrode.

The rear side electrode may include a ground interconnection provided in the rear surface of the semiconductor substrate.

Alternatively, the rear side electrode may include a power supply interconnection provided in the rear surface of the semiconductor substrate.

According to further another aspect of the present invention, there is provided a semiconductor device, which comprises plural semiconductor chips stacked thicknesswise, wherein the semiconductor chips each include: a semiconductor substrate having a front surface and a rear surface; a functional device provided in the front surface of the semiconductor substrate; and a through-electrode electrically connected to the functional device and provided in a through-hole disposed on a lateral side of the functional device as extending thicknesswise through the semiconductor substrate, the through-electrode electrically connecting a front side and a rear side of the semiconductor substrate; wherein the through-electrode includes a seed layer having a portion disposed in a depthwise middle portion of the through-hole as closing the through-hole, a front side electrode disposed on a side of the through-hole closing portion of the seed layer closer to the front surface in the through-hole, and a rear side electrode disposed on a side of the through-hole closing portion of the seed layer closer to the rear surface in the through-hole.

According to still another aspect of the present invention, there is provided a semiconductor device comprising plural semiconductor chips stacked thicknesswise, wherein the semiconductor chips each include: a semiconductor substrate having a front surface and a rear surface; a functional device provided in the front surface of the semiconductor substrate; and a through-electrode electrically connected to the functional device and provided in a through-hole disposed on a lateral side of the functional device as extending thicknesswise through the semiconductor substrate, the through-electrode electrically connecting a front side and a rear side of the semiconductor substrate; wherein the through-electrode includes a front side electrode disposed in a front side recess which is provided in the front surface of the semiconductor substrate and partly constitutes the through-hole, and a rear side electrode disposed in a rear side recess which is provided in the rear surface of the semiconductor substrate in communication with the front side recess and partly constitutes the through-hole; wherein the rear side recess occupies a major area of the rear surface including an area associated with a front side portion provided with the front side electrode.

The semiconductor chips may each include a bump provided on at least one of the front and rear surfaces and electrically connected to the through-electrode. In this case, the bump provided on one of each adjacent pair of the semiconductor chips is connected to the bump provided on the other semiconductor chip.

The foregoing and other objects, features and effects of the present invention will become more apparent from the following description of the preferred embodiments with reference to the attached drawings.

BRIEF DESCRIPTION OF THE DRAWINGS

FIGS. 6(a) to 6(d) are schematic sectional views illustrating the constructions of semiconductor chips according to a third embodiment of the present invention;

FIGS. 14(a) to 14(h) are schematic sectional views for explaining a first production method for the semiconductor device shown in FIG. 12;

FIGS. 15(a) to 15(e) are schematic sectional views for explaining a second production method for the semiconductor device shown in FIG. 12;

FIGS. 16(a) to 16(d) are schematic sectional views for explaining a production method for a semiconductor device similar in construction to the semiconductor device shown in FIG. 12;

DESCRIPTION OF THE PREFERRED EMBODIMENTS

Figure 1:
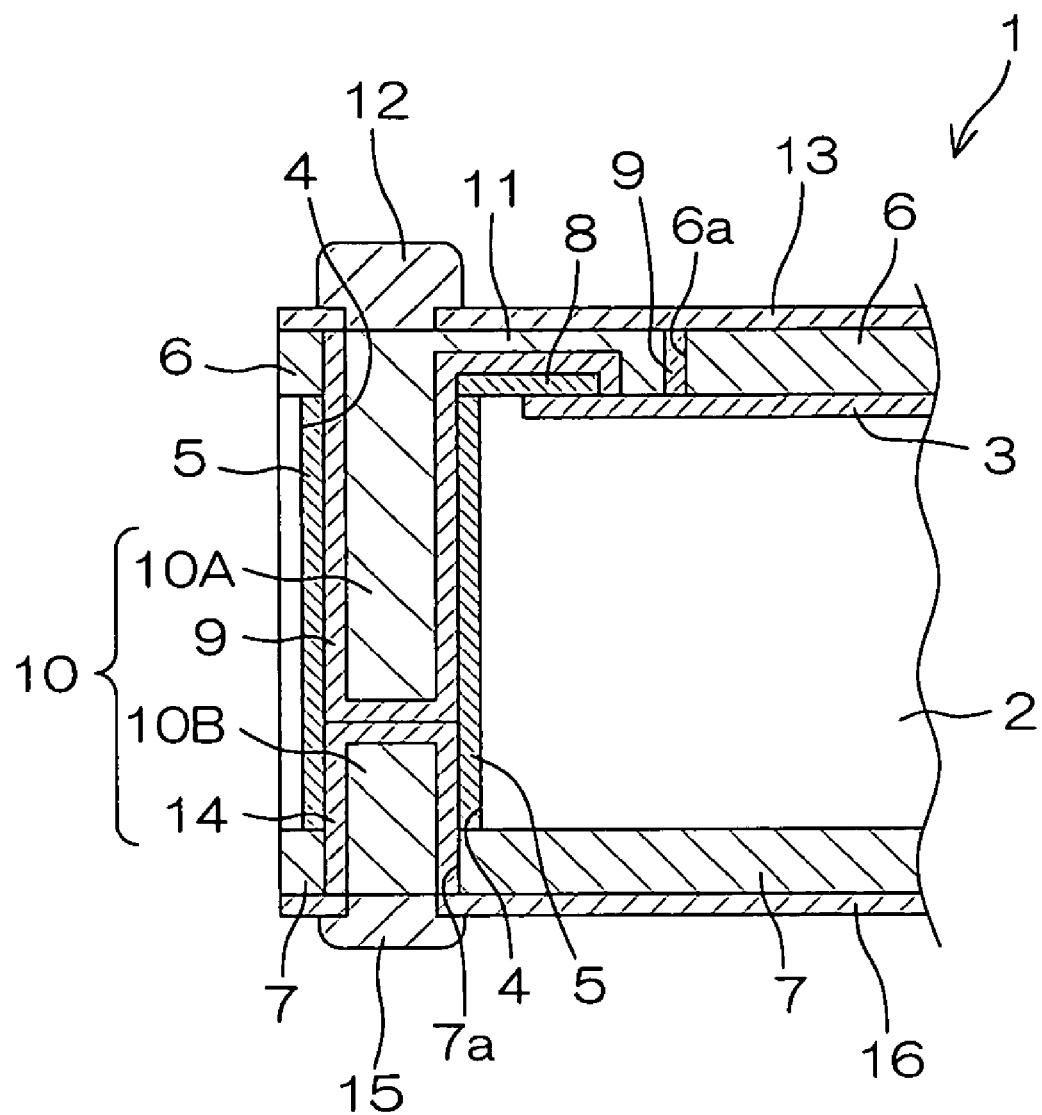
FIG. 1 is a schematic sectional view illustrating the construction of a semiconductor chip according to a first embodiment of the present invention.

FIG. 1 is a schematic sectional view illustrating the construction of a semiconductor chip according to a first embodiment of the present invention.

The semiconductor chip 1 includes a semiconductor substrate 2 of silicon. The semiconductor substrate 2 (semiconductor chip 1) has a thickness of about 100 μm. A functional device 3 having a plurality of electrodes are provided in one surface (hereinafter referred to as "front surface") of the semiconductor substrate 2. A through-hole 4 extending thicknesswise through the semiconductor substrate 2 is provided on a lateral side of the functional device 3. An insulation film 5 of silicon oxide ($SiO_2$) is provided on an inner peripheral surface of the through-hole 4.

A hard mask 6 having an opening 6a is provided on the front surface of the semiconductor substrate 2. The hard mask 6 is composed of silicon oxide. A part of the functional device 3 and the through-hole 4 are present in the opening 6a.

An insulation film 8 having a pattern which exposes the part of the functional device 3 is provided in the opening 6a on the front surface of the semiconductor substrate 2. A front side seed layer 9 of copper (Cu) is provided on interior surfaces of the opening 6a and the through-hole 4. More specifically, the front side seed layer 9 extends from the front surface of the semiconductor substrate 2 to a depth of 70 μm in the through-hole 4, and further extends perpendicularly to the through-hole 4 at a depth of about 70 μm as measured thicknesswise from the front surface of the semiconductor substrate 2 to close the through-hole 4. The front side seed layer 9 is also present on the interior surface of the through-hole 4 (on the insulation film 5).

A portion of the through-hole 4 defined by the front side seed layer 9 and a portion of the opening 6a aligned with the through-hole 4 are filled with a front side electrode 10A. The front side electrode 10A is disposed on a side of to the through-hole closing portion of the front side seed layer 9 closer to the front surface.

The other portion of the opening 6a not filled with the front side electrode 10A is filled with an interconnection member 11 which is integral with the front side electrode 10A and electrically connected to one of the electrodes of the functional device 3. The front side electrode 10A and the interconnection member 11 are composed of copper. The surfaces of the front side electrode 10A and the interconnection member 11 are flush with the surface of the hard mask 6.

A front side insulation film 13 of silicon oxide or silicon nitride ($Si_3N_4$) is provided on the surfaces of the interconnection member 11 and the hard mask 6. The provision of the front side insulation film 13 is optional and, hence, is not necessarily required. The front side insulation film 13 has an opening which exposes the front side electrode 10A. A bump (projection electrode) 12 projecting from the surface of the front side insulation film 13 is connected to the front side electrode 10A via the opening.

A hard mask 7 having an opening 7a in alignment with the through-hole 4 is provided on a surface (hereinafter referred to as "rear surface") of the semiconductor substrate 2 opposite from the front surface.

A rear side seed layer 14 of copper is provided in the through-hole 4 as extending from the rear surface of the semiconductor substrate 2 to a depth of 30 μm as measured from the rear surface. The rear side seed layer 14 closes the through-hole 4 in contact with the through-hole closing portion of the front side seed layer 9, and is also present on the inner peripheral surface of the through-hole 4 and the inner peripheral surface of the opening 7a of the hard mask 7.

A portion of the through-hole 4 defined by the rear side seed layer 14 and the opening 7a are filled with a rear side electrode 10B. The rear side electrode 10B is disposed on a side of the through-hole closing portion of the rear side seed layer 14 closer to the rear surface. The rear side electrode 10B is composed of copper.

The surface of the rear side electrode 10B is flush with the surface of the hard mask 7. A rear side insulation film 16 of silicon oxide or silicon nitride is provided on the surface of the hard mask 7. The provision of the rear side insulation film 16 is optional and, hence, is not necessarily required. The rear side insulation film 16 has an opening which exposes the rear side electrode 10B. A bump 15 projecting from the rear surface of the rear side insulation film 16 is connected to the rear side electrode 10B via the opening.

The front side electrode 10A, the front side seed layer 9, the rear side seed layer 14 and the rear side electrode 10B constitute a through-electrode 10 which provides a conduction path extending through the semiconductor substrate 2 between the front side and the rear side of the semiconductor substrate 2. The through-electrode 10 is isolated from the semiconductor substrate 2 by the insulation film 5 and the hard masks 6, 7.

Thus, the electrical connection to the electrode of the functional device 3 via the interconnection member 11 can be established from the front side of the semiconductor chip 1 via the bump 12, and from the rear side of the semiconductor chip 1 via the bump 15. The length of the interconnection between the front side and the rear side of the semiconductor substrate 2 is reduced by the provision of the through-electrode 10 extending through the semiconductor substrate 2.

The semiconductor substrate 2 is virtually free from a metal impurity attributable to the through-electrode 10, so that the semiconductor chip 1 has excellent characteristics.

Since the thickness of the semiconductor substrate 2 (semiconductor chip 1) is about 100 μm, the semiconductor chip 1 has a sufficiently high rigidity. Thus, semiconductor chips 1 each having the aforesaid construction can properly be assembled into a semiconductor device without warp thereof.

FIGS. 2(a) to 2(d) are schematic sectional views illustrating the constructions of semiconductor chips according to a second embodiment of the present invention. In FIGS. 2(a) to 2(d), components corresponding to those shown in FIG. 1 are denoted by the same reference characters as in FIG. 1, and no explanation will be given thereto. These semiconductor chips 21, 26, 33, 34 each include a ground (earth) interconnection 22, 27 provided on the rear surface of the semiconductor substrate 2.

Figure 2A:
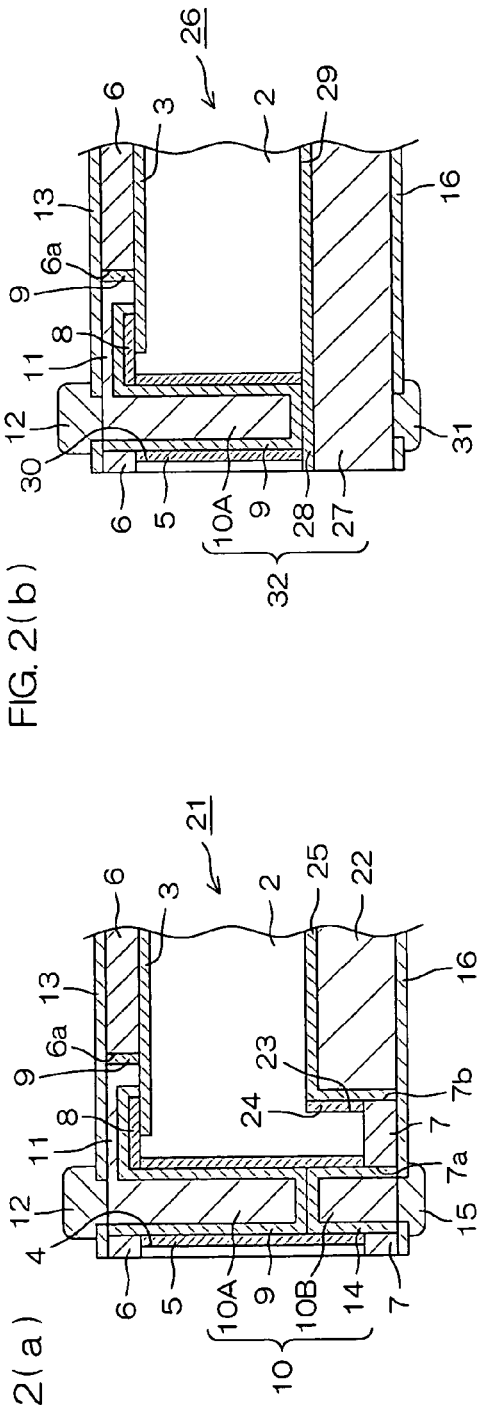
FIGS. 2(a) to 2(d) are schematic sectional views illustrating the constructions of semiconductor chips according to a second embodiment of the present invention.

In the semiconductor chip 21 shown in FIG. 2(a), the semiconductor substrate 2 has a grounding recess 23 provided in the rear surface thereof on a lateral side of the through-hole 4. An insulation film 24 is provided on a side wall of the grounding recess 23. The hard mask 7 has an opening 7b in addition to the opening 7a. The opening 7b is generally aligned with the grounding recess 23 along the thickness of the semiconductor substrate 2.

A rear side seed layer 25 of copper is provided on interior surfaces of the grounding recess 23 and the opening 7b. A barrier metal layer not shown is provided between the semiconductor substrate 2 and a portion of the rear side seed layer 25 present on the bottom of the grounding recess 23. The portion of the rear side seed layer 25 present on the bottom of the grounding recess 23 and the through-hole closing portion of the rear side seed layer 14 are located substantially in the same plane.

The grounding recess 23 and the opening 7 bare filled with the ground interconnection 22 of copper. The surfaces of the ground interconnection 22, the hard mask 7 and the rear side electrode 10B are flush with each other. The rear side insulation film 16 is provided on the surfaces of the hard mask 7 and the ground interconnection 22. The provision of the rear side insulation film 16 is optional and, hence, is not necessarily required.

The ground interconnection 22 and the through-electrode 10 are electrically isolated from each other by the hard mask 7 and the insulation films 5, 24. The ground interconnection 22 may be adapted, for example, to ground the rear surface of the semiconductor substrate 2. A bump similar to the bump 15 may be connected to the ground interconnection 22 via an opening (not shown) formed in the rear side insulation film 16. The semiconductor chip 21 may be connected to another semiconductor chip or a wiring board via the bump.

In this embodiment, the through-electrode 10 and the bumps 12, 15 constitute a part of a signal interconnection. The ground interconnection 22 may cover a major area of the rear surface of the semiconductor substrate 2 excluding the through-electrode 10. The ground interconnection 22 of copper has a higher heat conductivity and, hence, functions as a heat sink. Heat dissipation from the semiconductor chip 21 can be increased by increasing the area of the ground interconnection 22.

The semiconductor substrate 2 has a maximum thickness of about 100 µm. A portion of the semiconductor substrate 2 formed with the grounding recess 23 has a smaller thickness (e.g., 70 µm). The grounding recess 23 is filled with the ground interconnection 22, so that the total thickness of the semiconductor substrate 2 and the ground interconnection 22 is about 100 µm. That is, the semiconductor chip 21 uniformly has a thickness of about 100 µm and, hence, has a sufficiently high rigidity.

Figure 2B:
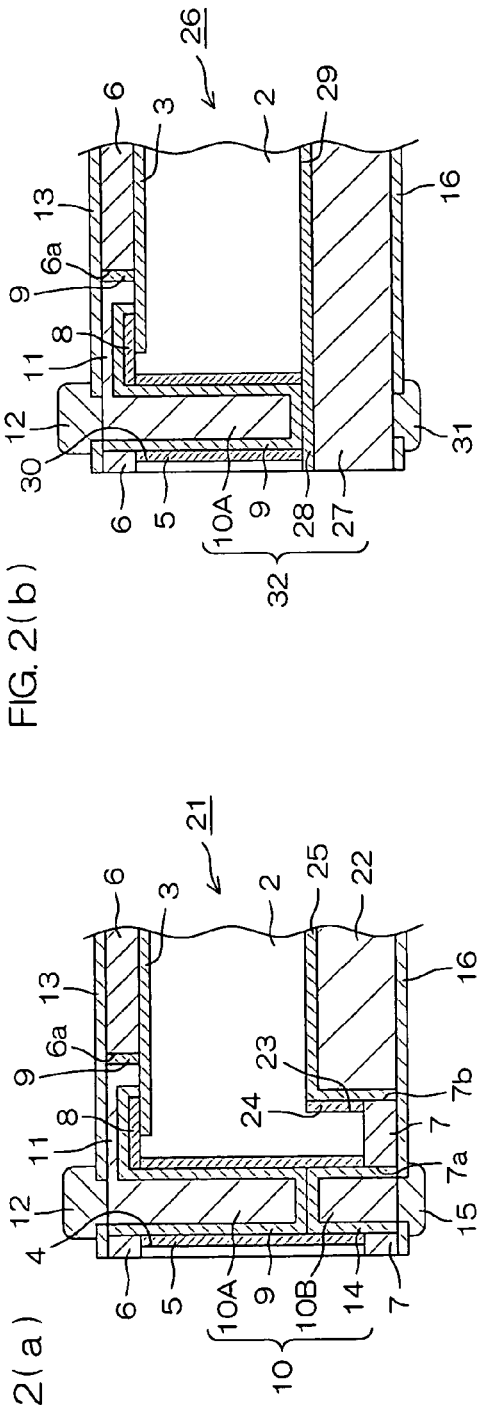

In the semiconductor chip 26 shown in FIG. 2(b), the ground interconnection 27 of copper is provided in the rear surface thereof. A grounding recess 29 is provided in a wider area of the rear surface of the semiconductor substrate 2 including an area associated with a front side portion provided with the front side electrode 10A. The grounding recess 29 opens to an end face (a left end face in FIG. 2(b)) of the semiconductor substrate 2.

The grounding recess has a depth of about 30 µm. A portion of the front side seed layer 9 is exposed to the bottom of the grounding recess 29. The grounding recess 29 and a hole in which the front side electrode 10A is disposed communicate with each other to constitute a through-hole 30. A rear side seed layer 28 of copper is provided on an interior surface of the grounding recess 29 including the exposed portion of the front side seed layer 9. The ground interconnection 27 is embedded in the grounding recess 29. The ground interconnection 27 is exposed to the end face (the left end face in FIG. 2(b) of the semiconductor chip 26.

The ground interconnection 27 has a planarized surface, and the rear side insulation film 16 is provided on the surface of the ground interconnection 27. The rear side insulation film 16 is not present on the end face of the ground interconnection 27. The provision of the rear side insulation film 16 is optional and, hence, is not necessarily required.

The rear side insulation film 16 has an opening which exposes a portion of the ground interconnection 27 located in alignment with the front side electrode 10A. A bump 31 is provided on the exposed portion of the ground interconnection 27. The end face of the ground interconnection 27 exposed to the end face of the semiconductor chip 26 is flush with an end face of the semiconductor substrate 2.

In this embodiment, the front side electrode 10A, the front side seed layer 9, the rear side seed layer 28 and the ground interconnection 27 constitute a through-electrode 32 which provides a conduction path between the front side and the rear side of the semiconductor substrate 2. With the aforesaid arrangement, the electrode of the functional device 3 connected to the interconnection member 11 is electrically connected to the ground interconnection 27 thereby to be grounded from the front side of the semiconductor chip 26 via the bump 12 or from the rear side of the semiconductor chip 26 via the bump 31.

Since the grounding recess 29 is filled with the ground interconnection 27, the semiconductor chip 26 uniformly has a thickness of about 100 µm and a sufficiently high rigidity.

Since the ground interconnection 27 is exposed to the end face of the semiconductor chip 26, heat can efficiently be dissipated from the end face of the semiconductor chip 26. Thus, heat dissipation from the semiconductor chip 26 is increased as compared with the semiconductor chip 21. The ground interconnection 27 is not necessarily required to be exposed to the end face of the semiconductor chip (see the semiconductor chip 33 shown in FIG. 2(c)). Even in this case, the electrode of the functional device 3 connected to the interconnection member 11 can be grounded via the bump 12 or 31.

Figure 2C:
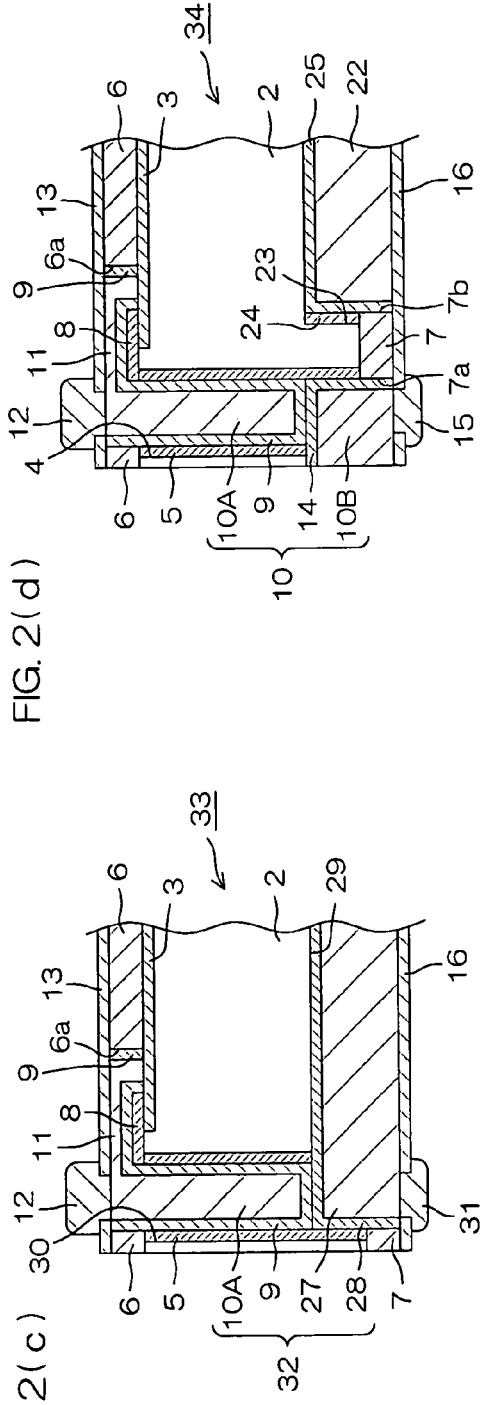
Figure 2D:
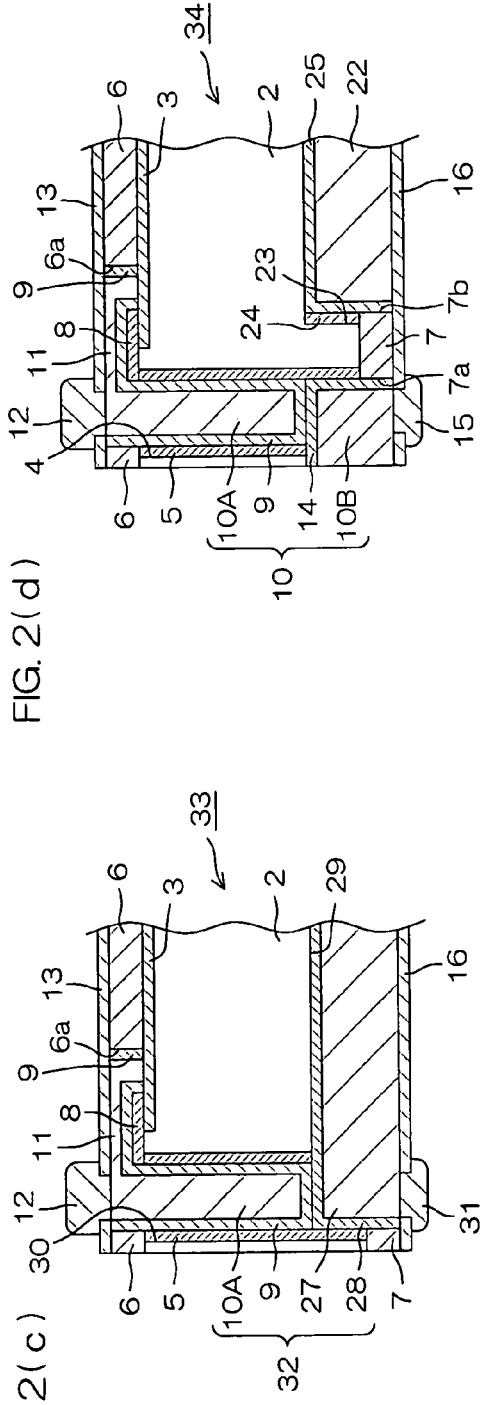

In the semiconductor chip 34 shown in FIG. 2(d), the rear side electrode 10B constitutes a part of the signal interconnection, and the ground interconnection 22 is isolated from the rear side electrode 10B. The rear side electrode 10B is exposed to an end face of the semiconductor chip 34. Thus, heat dissipation from the semiconductor chip 34 is increased.

Figure 3:
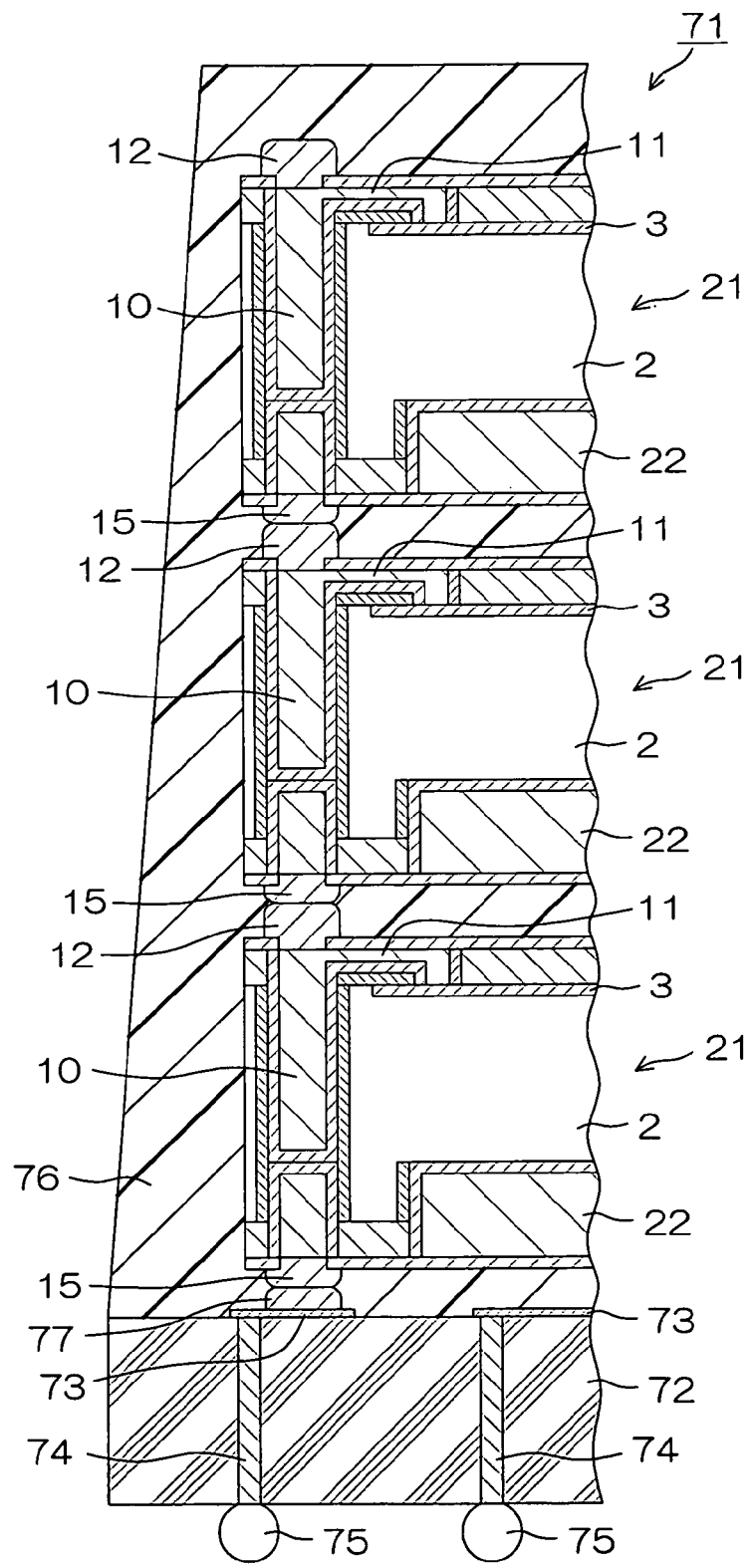
FIG. 3 is a schematic sectional view illustrating the construction of a semiconductor device including a plurality of semiconductor chips as shown in FIG. 2(a)

FIG. 3 is a schematic sectional view illustrating the construction of a semiconductor device including a plurality of semiconductor chips 21 as shown in FIG. 2(a). This semiconductor device 71 includes a wiring board 72, on which the plurality of semiconductor chips 21 (three semiconductor chips 21 in this embodiment) are stacked.

The wiring board 72 is composed of an insulative material. The wiring board 72 has through-electrodes 74 each extending thicknesswise through the wiring board 72. Metal balls 75 are respectively bonded onto the through-electrodes 74 on one surface of the wiring board 72. An interconnection 73 having a predetermined pattern is provided on a surface of the wiring board 72 opposite from the surface provided with the metal balls 75. The interconnection 73 is connected to the through-electrodes 74, and a bump 77 is provided on a predetermined portion of the interconnection 73.

The semiconductor substrates 2 of the respective semiconductor chips 21 are disposed parallel to the wiring board 72 with the front surfaces thereof (each provided with the functional device 3) facing away from the wiring board 72. Alternatively, the front surfaces of the semiconductor chips 21 may face toward the wiring board 72.

The bump 77 on the wiring board 72 is connected to the bump 15 provided on the rear surface of one of the semiconductor chips 21. The bump 12 provided on the front surface of one of each adjacent pair of the semiconductor chips 21 is connected to the bump 15 provided on the rear surface of the other semiconductor chip 21. Thus, the three semiconductor chips 21 are stacked thicknesswise one on another. The semiconductor chips 21 and the surface of the wiring board 72 provided with the interconnection 73 are sealed with a resin sealing 76.

With the aforesaid arrangement, one of the electrodes of the functional device 3 provided in each of the semiconductor chips 21 is electrically connected to a predetermined one of the metal balls 75 via the interconnection member 11, the through-electrode(s) 10, the bumps 15, 12, 77, the interconnection 73 and the through-electrode 74. Since the through-electrodes 10 of the respective semiconductor chips 21 are generally aligned with each other, the functional devices 3 of the semiconductor chips 21 disposed apart from the wiring board 72 can be connected to the interconnection 73 on the wiring board 72 via a shorter conduction path.

The ground interconnections 22 of the respective semiconductor chips 21 may be connected to another of the metal balls 75 via through-electrodes, bumps, interconnections and the like not shown.

The semiconductor device 71 can be mounted on a second wiring board via the metal balls 75. Thus, the electrodes of the functional devices 3 (including grounding electrodes) are electrically connected to the second wiring board. Since the plurality of semiconductor chips are stacked one on another, the semiconductor device 71 has a reduced footprint.

The bump 12 provided on the front surface of the uppermost one of the semiconductor chips 21 (most distant from the wiring board 72) is not necessarily required. In this case, the front surface of the uppermost semiconductor chip 21 may entirely be covered with the front side insulation film 13.

Figure 4:
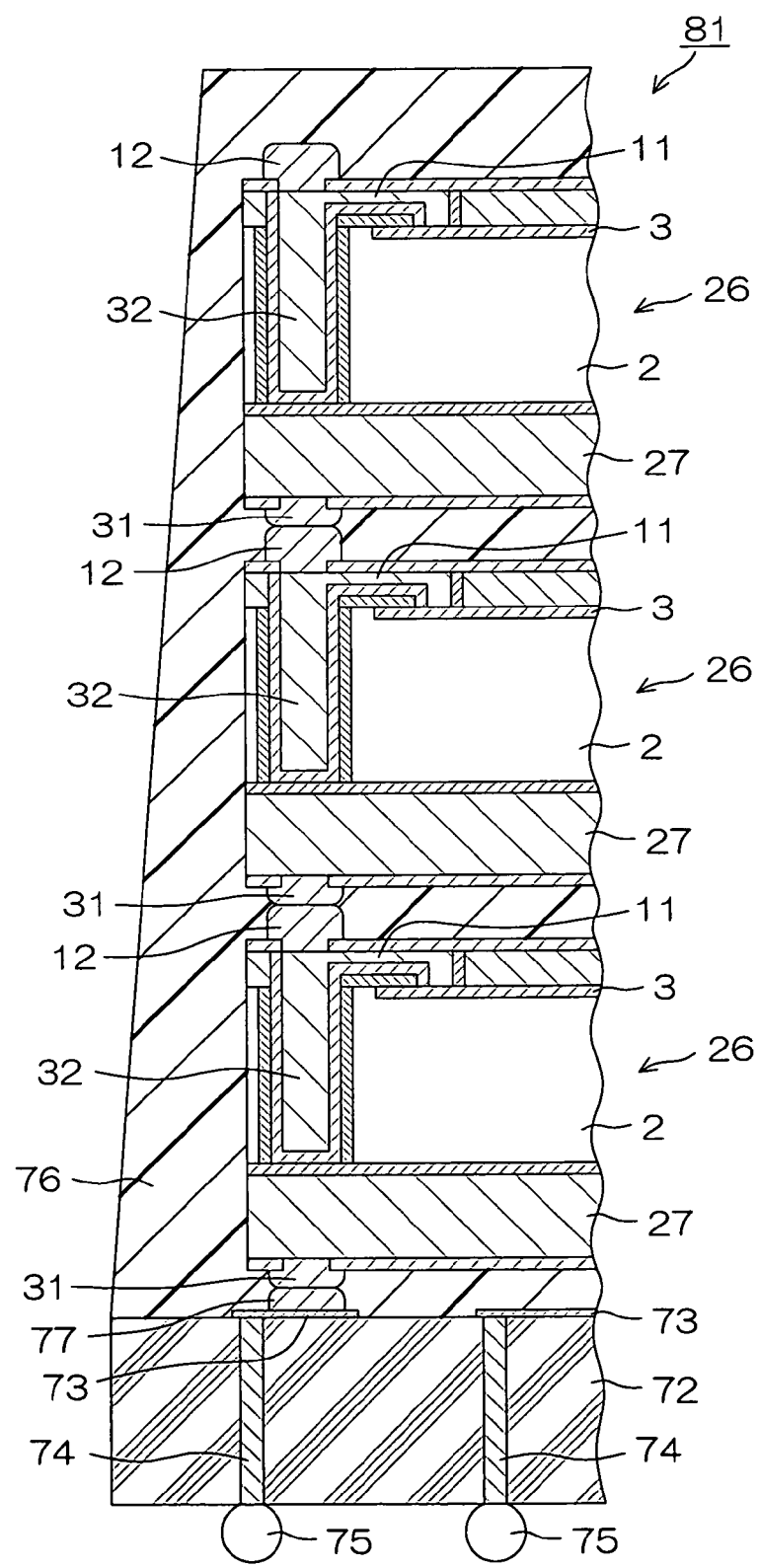
FIG. 4 is a schematic sectional view illustrating the construction of a semiconductor device including a plurality of semiconductor chips as shown in FIG. 2(b)

FIG. 4 is a schematic sectional view illustrating the construction of a semiconductor device including a plurality of semiconductor chips 26 as shown in FIG. 2(b). In FIG. 4, components corresponding to those shown in FIG. 3 are denoted by the same reference characters as in FIG. 3, and no explanation will be given thereto. In this semiconductor device 81, the plurality of semiconductor chips 26 (three semiconductor chips 26 in this embodiment) are stacked on the wiring board 72.

One of the electrodes of the functional device 3 provided in each of the semiconductor chips 26 is electrically connected to a predetermined one of the metal balls 75 via the interconnection member 11, the through-electrode(s) 32 (including the ground interconnection(s) 27), the bumps 31, 12, 77, the interconnection 73 and the through-electrode 74.

The ground interconnections 27 of the respective semiconductor chips 26 are exposed to the end faces of the semiconductor chips 26, so that heat dissipation from an end face of the semiconductor device 81 is increased. Where semiconductor chips 34 as shown in FIG. 2(d) are employed instead of the semiconductor chips 26, heat dissipation from the end face of the semiconductor device is also increased because the rear side electrodes 10B of the respective semiconductor chips 34 constituting a part of the signal interconnection are exposed to the end faces of the semiconductor chips 34.

Where portions of the ground interconnections 27 or the rear side electrodes 10B are exposed to the end faces of the semiconductor chips 26 or 34, electrical interconnection within the semiconductor device may be achieved via metal wires or the like connected to these exposed portions.

Figure 5:
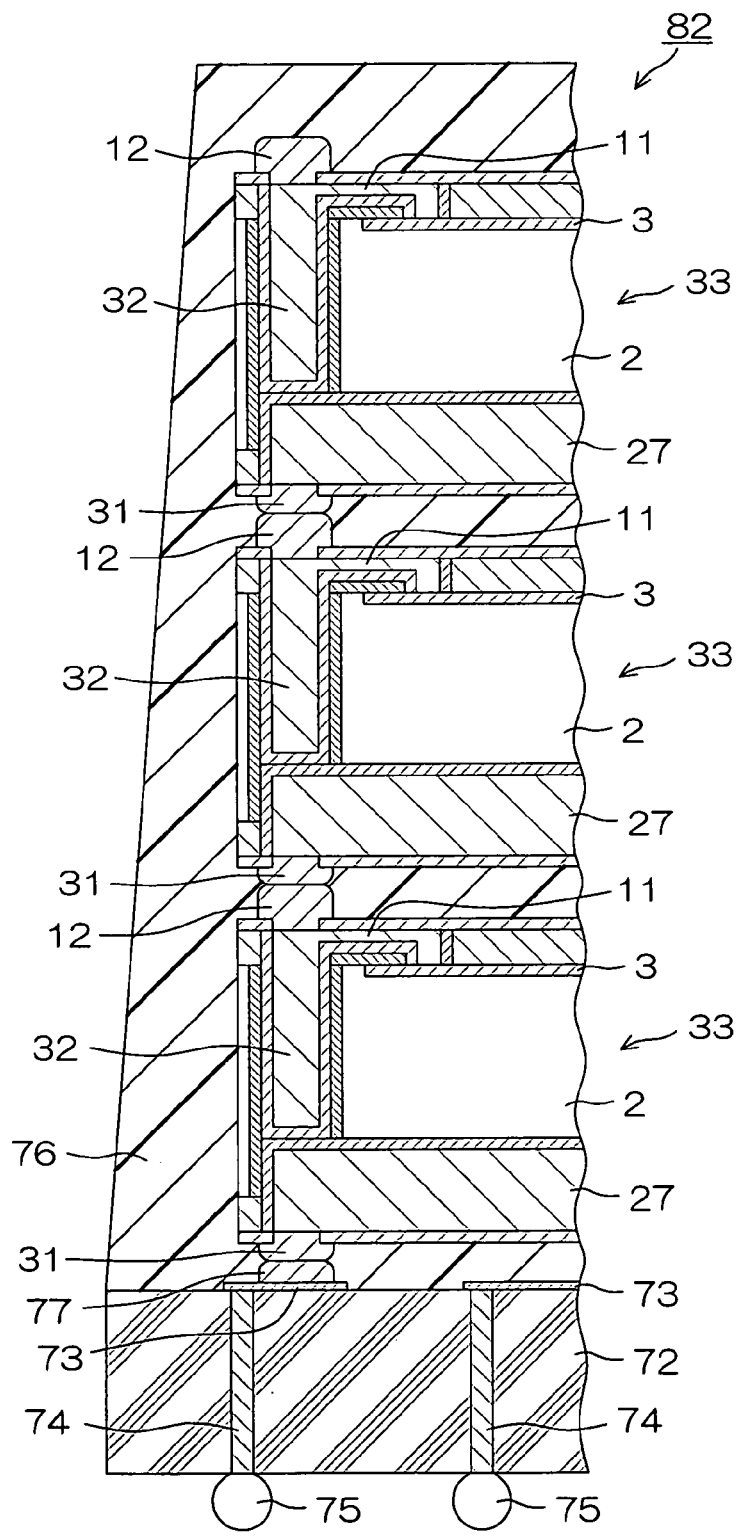
FIG. 5 is a schematic sectional view illustrating the construction of a semiconductor device including a plurality of semiconductor chips as shown in FIG. 2(c)

FIG. 5 is a schematic sectional view illustrating the construction of a semiconductor device including a plurality of semiconductor chips 33 as shown in FIG. 2(c). In FIG. 5, components corresponding to those shown in FIG. 3 are denoted by the same reference characters as in FIG. 3, and no explanation will be given thereto. In this semiconductor device 82, the plurality of semiconductor chips 33 (three semiconductor chips 33 in this embodiment) are stacked on the wiring board 72.

One of the electrodes of the functional device 3 provided in each of the semiconductor chips 33 is electrically connected to a predetermined one of the metal balls 75 via the interconnection member 11, the through-electrode(s) 32 (including the ground interconnection(s) 27), the bumps 31, 12, 77, the interconnection 73 and the through-electrode 74. Even where the ground interconnections 27 of the respective semiconductor chips 33 are not exposed to the end faces of the semiconductor chips 33 as in the semiconductor device 82, heat dissipation from the semiconductor device 82 can be increased by sufficiently increasing the areas of the ground interconnections 27.

The semiconductor devices 71, 81, 82 described above are each constructed so that the semiconductor chips 21, 26 or 33 having the same construction are stacked one on another, but maybe constructed so that semiconductor chips having different constructions are stacked one on another.

FIGS. 6(a) to 6(d) are schematic sectional views illustrating the constructions of semiconductor chips according to a third embodiment of the present invention. In FIGS. 6(a) to 6(d), components corresponding to those shown in FIGS. 1 and 2(a) to 2(d) are denoted by the same reference characters as in FIGS. 1 and 2(a) to 2(d), and no explanation will be given thereto.

In the semiconductor chips 41, 44, 45, 46, the ground interconnection 22, 27 is provided on the rear surface of the semiconductor substrate 2. One or more dummy bumps 42, 43 (two dummy bumps 42 and two dummy bumps 43 in this embodiment) having no electrical connection are provided in addition to the bumps 12, 15, 31 on front and rear surfaces of the semiconductor chip 41, 44, 45, 46.

The dummy bumps 42 and the dummy bumps 43 are metal projections having substantially the same size and shape as the bump 12 and the bump 15, 31, respectively. The bump 12 and the dummy bumps 42 have substantially the same height, and the bump 15, 31 and the bumps 43 have substantially the same height.

The semiconductor chip 41 shown in FIG. 6(a) has substantially the same construction as the semiconductor chip 21 shown in FIG. 2(a), and the ground interconnection 22 provided in the rear surface of the semiconductor chip 41 is isolated from the through-electrode 10. Portions of the ground interconnection 22 are exposed from openings formed at predetermined positions in the rear side insulation film 16, and the dummy bumps 43 are connected to the exposed portions of the ground interconnection 22.

The dummy bumps 42 are disposed at positions on the front surface of the semiconductor chip 41 opposite from the dummy bumps 43 with respect to the semiconductor chip 41. The dummy bumps 42 are present on the front side insulation film 13, and are not electrically connected to any functional device 3.

Two semiconductor chips 41 each having such a construction can vertically be stacked with the bump 12 and the dummy bumps 42 of one of the semiconductor chips 41 being respectively connected to the bump 15 and the dummy bumps 43 of the other semiconductor chip 41. In this case, the dummy bumps 43, 42 are not employed for electrical connection, but serve to efficiently dissipate heat generated in the functional devices 3 of the semiconductor chips 41. The heat generated in the functional device 3 of the one semiconductor chip 41 is conducted from the front side of the one semiconductor chip 41 to the ground interconnection 22 of the other semiconductor chip 41 through the thin interconnection layer (including the front side insulation film 13) between the functional device 3 and the dummy bumps 42 and through the dummy bumps 42 and 43, and dissipated from the ground interconnection 22 of the other semiconductor chip 41. The ground interconnection 22 may electrically be grounded via a bump not shown.

The semiconductor chip 44 shown in FIG. 6(b) has substantially the same construction as the semiconductor chip 26 shown in FIG. 2(b), and the ground interconnection 27 provided in the rear surface of the semiconductor chip 44 is electrically connected to the front side electrode 10A and exposed to an end face of the semiconductor chip 44. Portions of the ground interconnection 27 are exposed from openings formed at predetermined positions in the rear side insulation film 16. The dummy bumps 43 as well as the bump 31 are connected to the exposed portions of the ground interconnection 27.

The dummy bumps 42 are disposed at positions on the front surface of the semiconductor chip 44 opposite from the dummy bumps 43 with respect to the semiconductor chip 44. The dummy bumps 42 are present on the front side insulation film 13, and are not electrically connected to any functional device 3.

Two semiconductor chips 44 each having such a construction can vertically be stacked with the bump 12 and the dummy bumps 42 of one of the semiconductor chips 44 being respectively connected to the bump 31 and the dummy bumps 43 of the other semiconductor chip 44. In this case, heat generated in the semiconductor chips 44 is efficiently dissipated to the outside through the end faces of the ground interconnections 27 exposed to the end faces of the semiconductor chips 44 and through the dummy bumps 43, 42.

The semiconductor chips 44 are electrically connected (grounded) by connecting the bump 12 of the one semiconductor chip 44 to the bump 31 of the other semiconductor chip 44.

The ground interconnection 27 is not necessarily required to be exposed to the end face of the semiconductor chip (see the semiconductor chip 45 shown in FIG. 6(c)). In this case, the heat dissipation from the end face of the semiconductor chip 45 is reduced as compared with the semiconductor chip 44. However, the heat can efficiently be dissipated through the dummy bumps 42, 43.

The semiconductor chip 46 shown in FIG. 6(d) has substantially the same construction as the semiconductor chip 41 shown in FIG. 6(a), and the ground interconnection 22 provided in the rear surface of the semiconductor chip 46 is electrically isolated from the rear side electrode 10B electrically connected to the front side electrode 10A. In the semiconductor chip 46, the dummy bumps 43 are connected to the ground interconnection 22, and the dummy bumps 42 are provided on the front side insulation film 13. The rear side electrode 10B is exposed to the end face of the semiconductor chip 46, whereby heat dissipation from the semiconductor chip 46 is increased as compared with the heat dissipation from the semiconductor chip 41.

FIGS. 7(a) to 7(d) are schematic sectional views illustrating the constructions of semiconductor chips according to a fourth embodiment of the present invention. In FIGS. 7(a) to 7(d), components corresponding to those shown in FIGS. 1 and 2(a) to 2(d) are denoted by the same reference characters as in FIGS. 1 and 2(a) to 2(d), and no explanation will be given thereto.

The semiconductor chips 51, 54, 55 and 56 have substantially the same constructions as the semiconductor chips 41, 44, 45 and 46 shown in FIGS. 6(a) to 6(d), respectively. Dummy patterns 52, 53 are provided instead of the dummy bumps 42, 43. The dummy pattern 52 is provided in association with the dummy pattern 53.

Like the dummy bumps 42, 43, the dummy patterns 52, 53 are not used for electrical connection. The bump 12 and the dummy pattern 52 have substantially the same height, and the bump 15, 31 and the dummy pattern 53 have substantially the same height.

The dummy patterns 52, 53 are metal protuberances each having a greater plan area on the semiconductor substrate 2 than the dummy bumps 42, 43. Two semiconductor chips 51, 54, 55 or 56 having the same construction can vertically be stacked with the bump 12 and the dummy pattern 52 of one of the semiconductor chips 51, 54, 55 or 56 being respectively connected to the bump 15, 31 and the dummy pattern 53 of the other semiconductor chip 51, 54, 55, 56.

Heat generated in the functional device 3 of the one semiconductor chip 51, 54, 55, 56 can more efficiently be conducted from the front side of the one semiconductor chip 51, 54, 55, 56 to the ground interconnection 22, 27 of the other semiconductor chip 51, 54, 55, 56 through the dummy patterns 52, 53 than through the dummy bumps 42, 43. The heat conducted to the ground interconnection 22, 27 is dissipated out of the other semiconductor chip 51, 54, 55, 56.

Figure 7A:
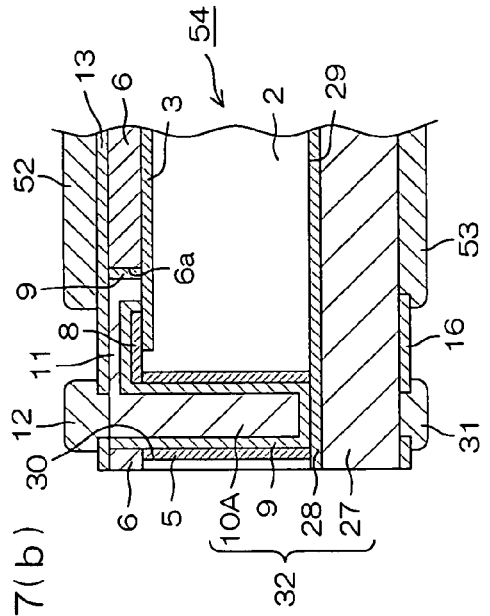
FIGS. 7(a) to 7(d) are schematic sectional views illustrating the constructions of semiconductor chips according to a fourth embodiment of the present invention.

In the semiconductor chip 51 shown in FIG. 7(a), the rear side electrode 10B is not exposed to the end face of the semiconductor chip 51, and the ground interconnection 22 is isolated from the through-electrode 10 constituting a part of the signal interconnection.

Figure 7B:
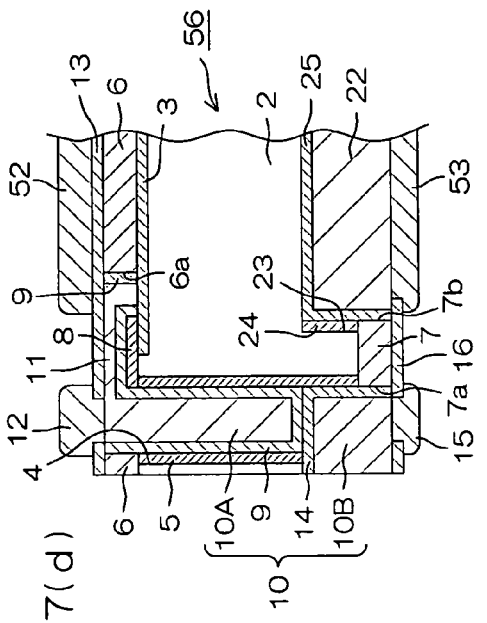

In the semiconductor chip 54 shown in FIG. 7(b), the front side electrode 10A is connected to the ground interconnection 27, and the ground interconnection 27 is exposed to the end face of the semiconductor chip 54.

Figure 7C:
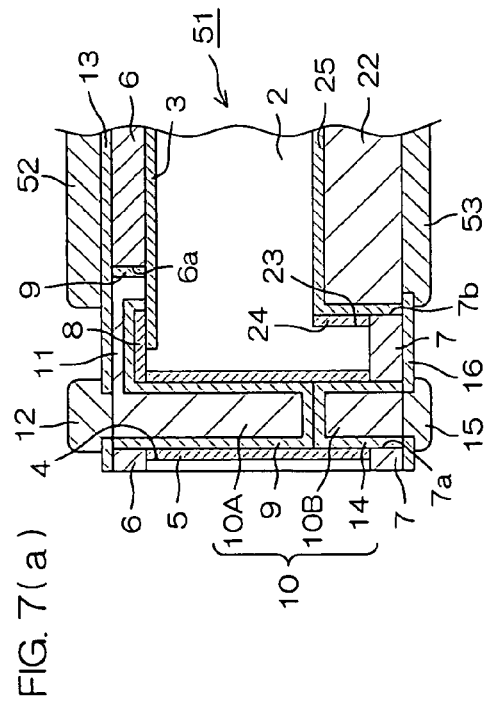

In the semiconductor chip 55 shown in FIG. 7(c), the front side electrode 10A is connected to the ground interconnection 27, and the ground interconnection 27 is not exposed to the end face of the semiconductor chip 55.

Figure 7D:
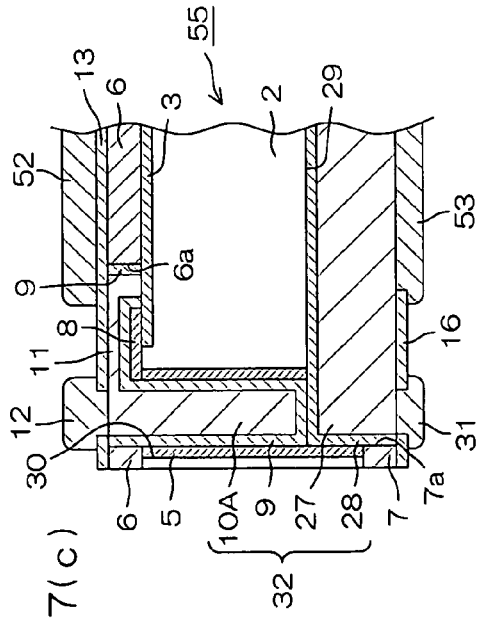

In the semiconductor chip 56 shown in FIG. 7(d), the rear side electrode 10B is exposed to the end face of the semiconductor chip 56, and the ground interconnection 22 is isolated from the through-electrode 10 constituting a part of the signal interconnection.

Figure 8:
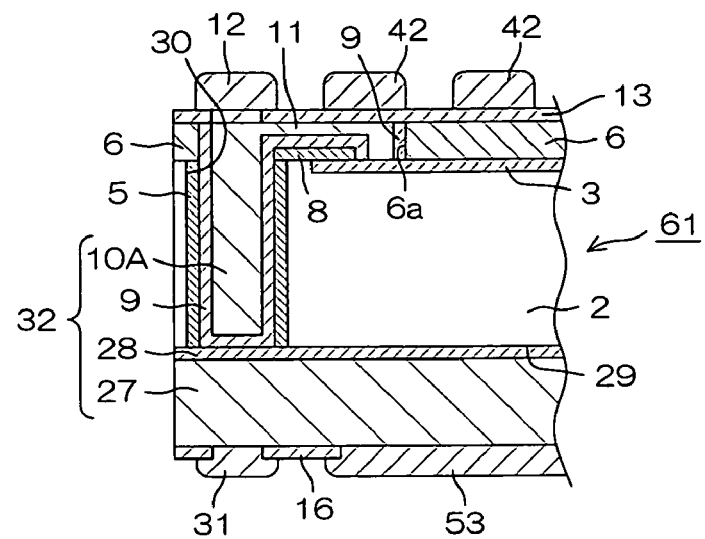
FIG. 8 is a schematic sectional view illustrating the construction of a semiconductor chip according to a fifth embodiment of the present invention.

FIG. 8 is a schematic sectional view illustrating the construction of a semiconductor chip according to a fifth embodiment of the present invention.

This semiconductor chip 61 has substantially the same construction as the semiconductor chip 44 shown in FIG. 6(b) or the semiconductor chip 54 shown in FIG. 7(b). In the semiconductor chip 61, the ground interconnection 27 provided in the rear surface is electrically connected to the front side electrode 10A, and exposed to the end face of the semiconductor chip 61.

The dummy pattern 53 is connected to the ground interconnection 27, and the one or more dummy bumps 42 (two dummy bumps 42 in this embodiment) are provided on the front side insulation film 13 within the area corresponding to the formation area of the dummy pattern 53.

Two semiconductor chips 61 each having such a construction can vertically be stacked with the bump 12 and the dummy bumps 42 of one of the semiconductor chips 61 being respectively connected to the bump 31 and the dummy pattern 53 of the other semiconductor chip 61. In this case, heat generated in the functional device 3 of the one semiconductor chip 61 can efficiently be conducted from the front side of the one semiconductor chip 61 to the ground interconnection 27 of the other semiconductor chip 61 through the dummy bumps 42 and the dummy pattern 53. The heat conducted to the ground interconnection 27 is dissipated out of the other semiconductor chip 61.

Figure 9:
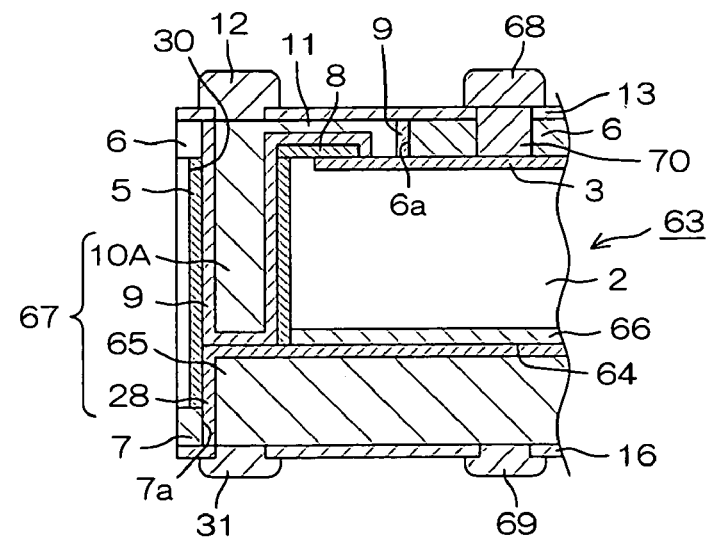
FIG. 9 is a schematic sectional view illustrating the construction of a semiconductor chip according to a sixth embodiment of the present invention.

FIG. 9 is a schematic sectional view illustrating the construction of a semiconductor chip according to a sixth embodiment of the present invention. In FIG. 9, components corresponding to those shown in FIGS. 1 and 2(a) to 2(d) are denoted by the same reference characters as in FIGS. 1 and 2(a) to 2(d), and no explanation will be given thereto.

This semiconductor chip 63 has substantially the same construction as the semiconductor chip 33 shown in FIG. 2(c) or the semiconductor chip 45 shown in FIG. 6(c). The semiconductor chip 63 includes a power supply interconnection 65 embedded in a power supply recess 64 instead of the ground interconnection 27 embedded in the grounding recess 29. The power supply interconnection 65 has a thickness of about 30 µm, for example, like the ground interconnection 22, 27.

The rear side seed layer 28 of copper is provided on an interior surface of the power supply recess 64. An insulation film 66 is provided between the semiconductor substrate 2 and the rear side seed layer 28. Thus, the rear side seed layer 28 and the power supply interconnection 65 are electrically isolated from the semiconductor substrate 2. The front side electrode 10A, the front side seed layer 9, the rear side seed layer 28 and the power supply interconnection 65 constitute a through-electrode 67 serving as a conduction path extending from the front side to the rear side of the semiconductor substrate 2.

The power supply interconnection 65 of the semiconductor chip 63 is used to be electrically connected to a power source, whereby electric power can be supplied to the functional device 3 provided in the front surface of the semiconductor chip 63 from the rear side via the through-electrode 67.

In addition to the bumps 12 and 31, bumps 68 and 69 are respectively provided on the front surface and the rear surface of the semiconductor chip 63. The bump 68 is disposed above the functional device 3, and electrically connected to an electrode of the functional device 3 via an interconnection member 70 extending through the hard mask 6 and the front side insulation film 13.

The bump 69 is disposed at a position on the rear surface of the semiconductor chip 63 opposite from the bump 68 with respect to the semiconductor chip 63. The bump 69 extends through the rear side insulation film 16 to be electrically connected to the power supply interconnection 65.

Figure 10:
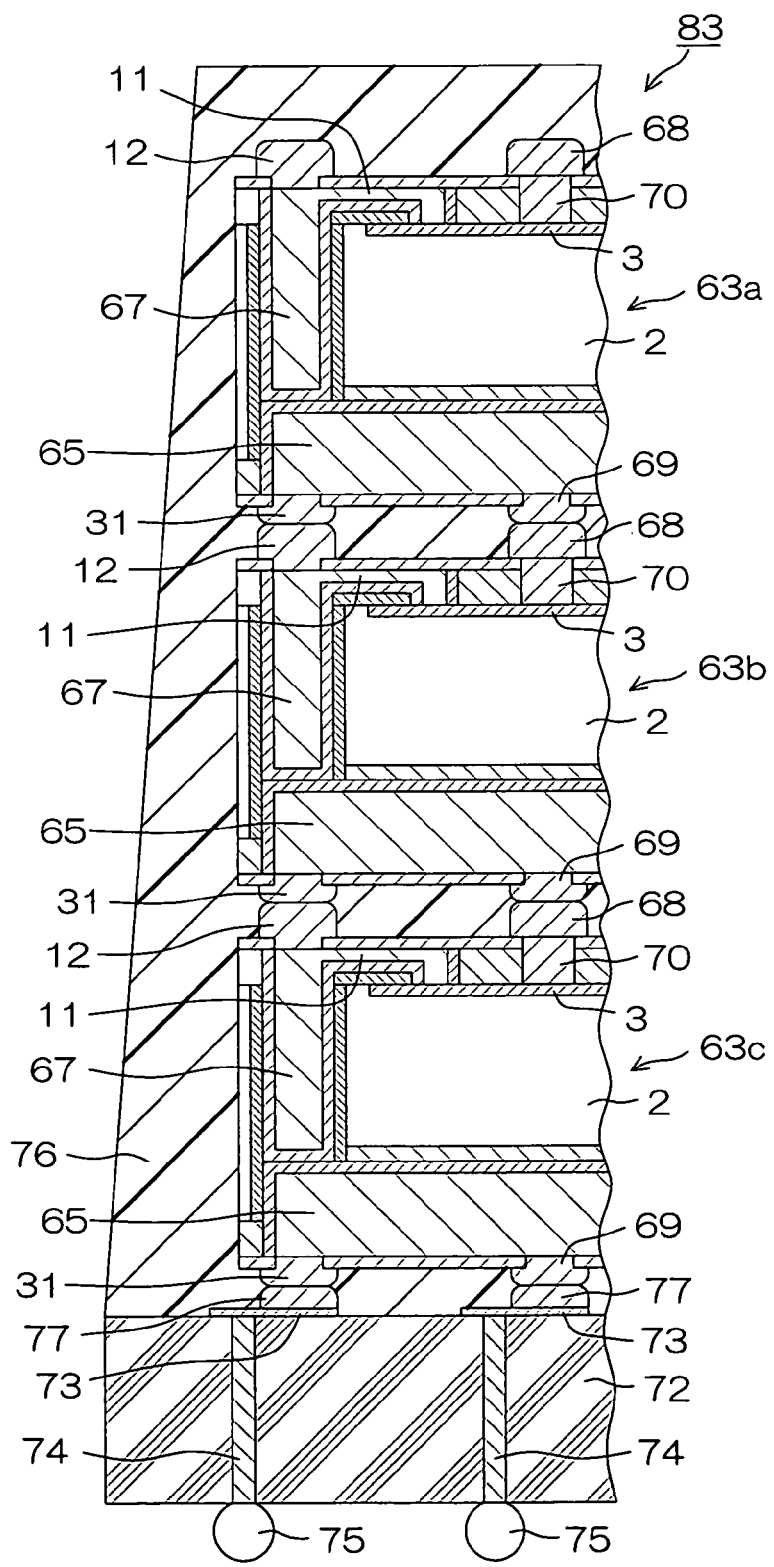
FIG. 10 is a schematic sectional view illustrating the construction of a semiconductor device including a plurality of semiconductor chips as shown in FIG. 9.

FIG. 10 is a schematic sectional view illustrating the construction of a semiconductor device including semiconductor chips 63a to 63c each having the same construction as the semiconductor chip 63 shown in FIG. 9. In FIG. 10, components corresponding to those shown in FIG. 3 are denoted by the same reference characters as in FIG. 3, and no explanation will be given thereto. In this semiconductor device 83, the semiconductor chips 63a to 63c are stacked on the wiring board 72.

The semiconductor chip 63a is located most distantly from the wiring board 72, and the semiconductor chip 63c is located closest to the wiring board 72. The bumps 31 and 69 of the semiconductor chips 63a, 63b are respectively connected to the bumps 12 and 68 of the semiconductor chips 63b, 63c. The bumps 31 and 69 of the semiconductor chip 63c are respectively connected to the bumps 77 of the wiring board 72.

Two electrodes of the functional device 3 provided in each of the semiconductor chips 63a to 63c are electrically connected to predetermined metal balls 75 via the interconnection members 11, 70, the through-electrodes 67 (including the power supply interconnections 65), the bumps 31, 69, 12, 68, 77, the interconnection 73 and the through-electrodes 74. That is, electric power is supplied to the functional devices 3 of the respective semiconductor chips 63a to 63c via the predetermined metal balls 75. The semiconductor device 83 has a so-called area array structure, which includes a multiplicity of metal balls 75 two-dimensionally arranged in properly spaced relation on a bottom surface thereof.

Since the power supply interconnection 65 has a relatively great thickness on the order of 30 μm, sufficiently great electric power can be supplied (a sufficiently high driving voltage can be applied) to the plural functional devices 3 provided above the wiring board 72 via the power supply interconnections 65.

The electric power is supplied, for example, to the functional device 3 of the semiconductor chip 63b via the through-electrode 67 and the interconnection member 11 of the semiconductor chip 63b as well as via the power supply interconnection 65 of the semiconductor chip 63a, the bumps 69, 68 and the interconnection member 70. Even where the semiconductor chips 63a to 63c are multi-layer LSIs, sufficiently great electric power is supplied to the functional devices 3 of the respective semiconductor chips 63a to 63c.

End faces of the power supply interconnections 65 may be exposed to the end faces of the respective semiconductor chips 63a to 63c. In this case, the electric power can also be supplied via the end faces of the power supply interconnections 65 exposed to the end faces of the respective semiconductor chips 63a to 63c stacked one on another.

Figure 11:
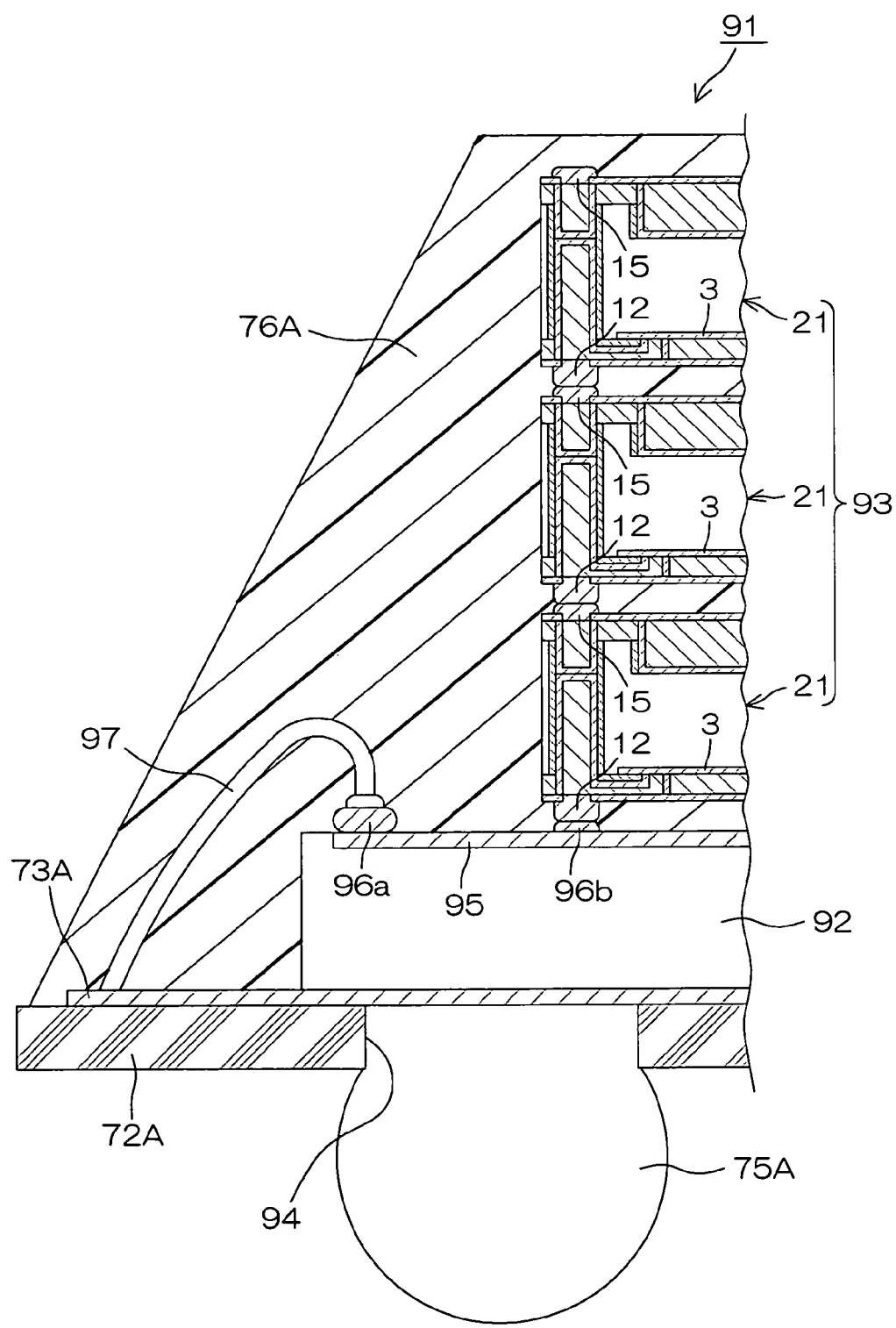
FIG. 11 is a schematic sectional view illustrating the construction of another semiconductor device including a plurality of semiconductor chips as shown in FIG. 2(a)

FIG. 11 is a schematic sectional view illustrating the construction of another semiconductor device including a plurality of semiconductor chips 21 as shown in FIG. 2(a). This semiconductor device 91 has a so-called BGA (ball grid array) package structure. The semiconductor device 91 includes a BGA board 72A and a semiconductor substrate 92, and the plurality of semiconductor chips 21 (three semiconductor chips 21 in this embodiment) are stacked on the BGA board 72A.

The BGA board 72A has the largest plan area, and the semiconductor chips 21 have the smallest plan area as seen along the thicknesses of the BGA board 72A, the semiconductor substrate 92 and the semiconductor chips 21. The bump 12 provided on the front surface of one of each adjacent pair of the semiconductor chips 21 is connected to the bump 15 provided on the rear surface of the other semiconductor chip 21. Thus, the three semiconductor chips 21 are stacked thicknesswise, thereby constituting a module 93.

The BGA board 72A is composed of an insulative material. The BGA board 72A has generally round through-holes 94 each extending thicknesswise therethrough. The through-holes 94 each have a diameter which is several times the thickness of the BGA board 72A. Solder balls 75A each having a diameter slightly greater than the diameter of the through-holes 94 are provided on one side of the BGA board 72A as partly fitted in the through-holes 94. Interconnections 73A having a predetermined pattern are provided on a surface of the BGA board 72A opposite from the one side of the BGA board 72A provided with the solder balls 75A. The interconnections 73A are respectively connected to the solder balls 75A.

The semiconductor substrate 92 is die-bonded onto the surface of the BGA board 72A provided with the interconnection 73A parallel to the BGA board 72A. A functional device 95 is provided in a surface of the semiconductor substrate 92 opposite from the BGA board 72A. The functional device 95 is provided with a plurality of electrodes, on which bumps 96a, 96b are provided.

The module 93 is connected to the surface of the semiconductor substrate 92 provided with the functional device 95 with the semiconductor chips 21 thereof being disposed parallel to the semiconductor substrate 92.

The bumps 96a are disposed on a surface portion of the semiconductor substrate 92 not opposed to the module 93, while the bump 96b is disposed on a surface portion of the semiconductor substrate 92 opposed to the module 93. The bumps 96a are respectively connected to the interconnections 73A via a bonding wire 97. The bump 96b is connected to the bump 12 of one of the semiconductor chips 21 of the module 93. That is, the front surfaces (each provided with the functional device 3) of the semiconductor chips 21 of the module 93 face toward the semiconductor substrate 92.

The module 93, the semiconductor substrate 92, the bonding wire 97 and the surface of the BGA board 72A provided with the interconnections 73A are sealed with a resin sealing 76A.

The semiconductor device 91 can be mounted on a second wiring board via the solder balls 75A. The functional devices 3 of the respective semiconductor chips 21 and the functional device 95 of the semiconductor substrate 92 are electrically connected to the second wiring board via the bonding wires 97, the interconnections 73A and the solder balls 75A.

Even where the semiconductor device 91 includes the semiconductor substrate 92 having a greater plan area than the semiconductor chips 21, the footprint of the semiconductor device 91 is nearly equal to the plan area of the semiconductor substrate 92 because the semiconductor chips 21 are stacked on the semiconductor substrate 92.

The module 93 is contained in the BGA package in this embodiment, but may be contained in a SOP (small outline package), a QFP (quad flat package) or a QFN (quad flat non-leaded package). In this case, the module 93 may be bonded onto a lead frame rather than on the BGA board 72A.

A module including one or more types of semiconductor chips 1, 26, 33, 34, 41, 44, 45, 46, 51, 54, 55, 56, 61, 63 may be employed instead of the module 93.

Figure 12:
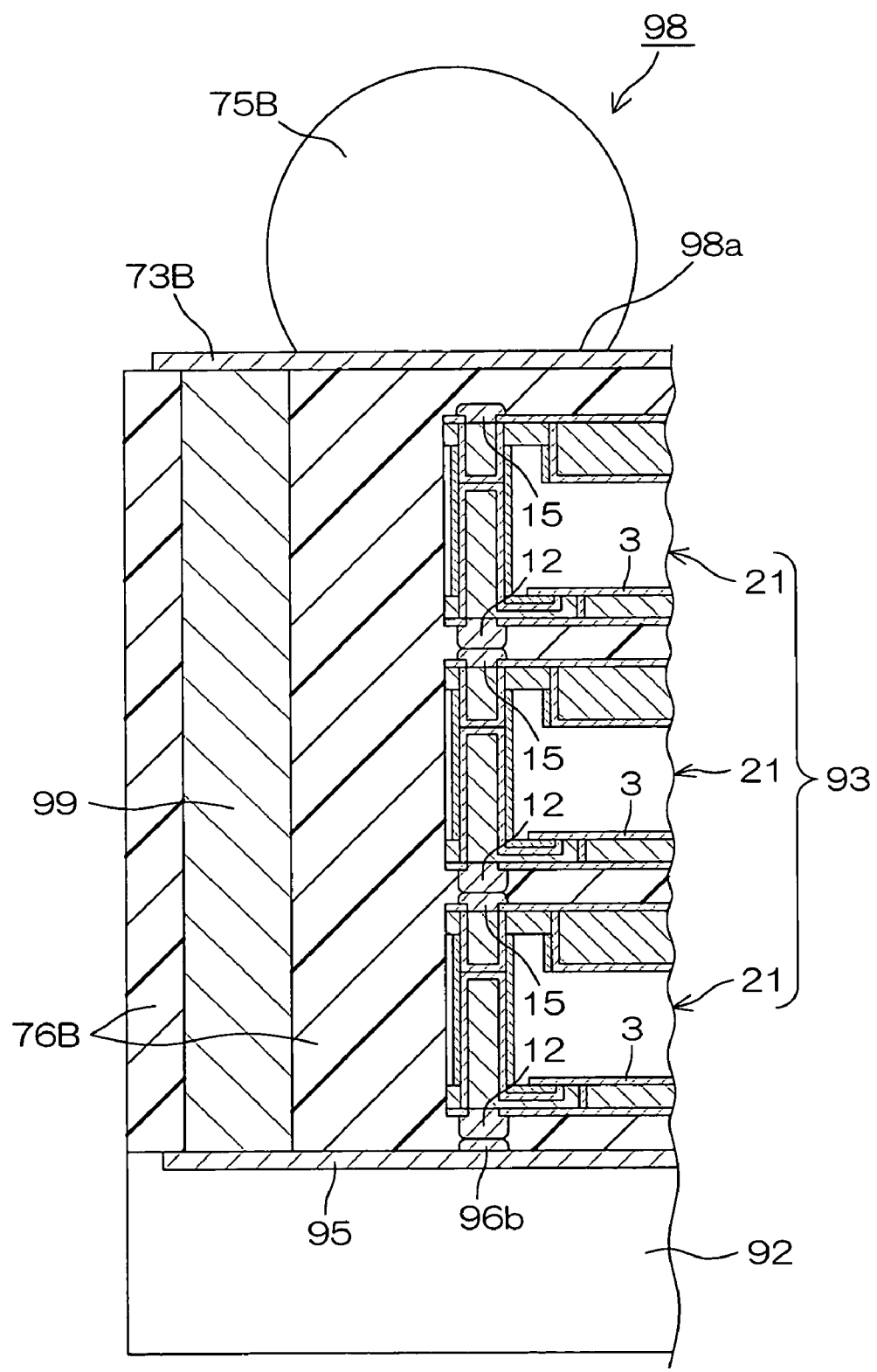
FIG. 12 is a schematic sectional view illustrating the construction of further another semiconductor device including a plurality of semiconductor chips as shown in FIG. 2(a)

FIG. 12 is a schematic sectional view illustrating the construction of further another semiconductor device including a plurality of semiconductor chips 21 as shown in FIG. 2(*a*). In FIG. 12, components corresponding to those shown in FIG. 11 are denoted by the same reference characters as in FIG. 11, and no explanation will be given thereto.

The semiconductor device 98 is a so-called wafer-level CSP (chip size package), and does not include the BGA board 72A as provided in the semiconductor device 91. In the semiconductor device 98, the module 93 constituted by the plurality of semiconductor chips 21 is provided on the semiconductor substrate 92.

The module 93 is bonded onto the semiconductor substrate 92 with the semiconductor chips 21 thereof being disposed parallel to the semiconductor substrate 92. The front surfaces of the semiconductor chips 21 (each provided with the functional device 3) face toward the semiconductor substrate 92. The module 93 and the surface of the semiconductor substrate 92 provided with the functional device 95 are sealed with a resin sealing 76B. The resin sealing 76B is generally aligned with the semiconductor substrate 92 as seen along the thickness of the semiconductor substrate 92. The semiconductor device 98 has a generally rectangular solid exterior shape, which is defined by the resin sealing 76B.

Re-interconnections 73B are provided on a surface 98*a* of the semiconductor device 98 opposite from the semiconductor substrate 92. Solder balls 75B are bonded onto predetermined portions of the re-interconnections 73B. The re-interconnections 73B are present on the resin sealing 76B, and are not directly electrically connected to the semiconductor chips 21 of the module 93.

The functional device 95 of the semiconductor substrate 92 has electrodes provided on a portion thereof not opposed to the module 93. The electrodes and the re-interconnections 73B are respectively electrically connected to each other via post electrodes 99 which extends thicknesswise through the resin sealing 76B.

The semiconductor device 98 can be mounted on a second wiring board via the solder balls 75B. The functional devices 3 of the respective semiconductor chips 21 and the functional device 95 of the semiconductor substrate 92 are electrically connected to the second wiring board via the post electrodes 99, the re-interconnections 73B and the solder balls 75B. The footprint of the semiconductor device 98 is nearly equal to the plan area of the semiconductor substrate 92. Thus, the footprint and thickness of the semiconductor device 98 are further reduced as compared with the semiconductor device 91.

FIGS. 13(*a*) to 13(*k*) are schematic sectional views for explaining a production method for the semiconductor chip 21 shown in FIG. 2(*a*). Although a plurality of semiconductor chips 21 are formed from a single semiconductor wafer (hereinafter referred to simply as "wafer") W, one of the semiconductor chips 21 to be formed in the wafer W is partly illustrated in FIGS. 13(*a*) to 13(*k*). A multiplicity of regions for the semiconductor chips 21 each having the final configuration shown in FIG. 2(*a*) are densely defined in the wafer W shown in FIGS. 13(*a*) to 13(*k*).

A hard mask 6 of silicon oxide having openings 6*a* in predetermined portions thereof is formed on one surface (hereinafter referred to as "front surface") of the wafer W provided with functional devices 3 by a CVD (chemical vapor deposition) method. Where the wafer W has a diameter of 8 inches, the wafer W has a thickness of about 725 μm. Where the wafer W has a diameter of 6 inches, the wafer W has a thickness of about 625 μm. Predetermined portions of the functional devices 3 and portions of the wafer W on lateral sides of the functional devices 3 are exposed in the openings 6*a*.

In turn, front side recesses 85 are respectively formed in the portions of the wafer W exposed in the openings 6*a* on the lateral sides of the functional devices 3 by reactive ion etching (RIE). The front side recesses 85 each have a depth of about 70 μm and a width and length of about 10 μm, for example. Then, insulation films 5, 8 of silicon oxide are formed on exposed interior surfaces of the openings 6*a* and the front side recesses 85 by a CVD method. At this time, the predetermined portions of the functional devices 3 are exposed from the insulation films 8.

Subsequently, a metal material 86 of copper is filled in the openings 6*a* and the front side recesses 85 of the resulting wafer W by a damascene process. More specifically, front side seed layers 9 of copper are formed on the insulation films 5,8, and then the metal material 86 of copper is deposited in the openings 6*a* and the front side recesses 85 by a plating process employing the front side seed layers 9 as a seed. Thus, the metal material 86 is electrically connected to the predetermined portions of the functional devices 3.

The metal material 86 is also deposited on the hard mask 6 outside the openings 6*a* and the front side recesses 85.

Subsequently, the front surface of the resulting wafer W, i.e., the surface of the wafer W provided with the metal material 86, is polished (ground) by a CMP (chemical mechanical polishing) method, whereby the surface of the hard mask 6 becomes flush with the surfaces of the resulting metal material portions 86. A part of the metal material portion 86 present in the front side recess 85 and extending in alignment with the front side recess 85 in the opening 6*a* serves as a front side electrode 10A, and the other part of the metal material portion 86 serves as an interconnection member 11 which electrically connects the front side electrode 10A to the functional device 3.

In turn, a front side insulation film 13 of silicon oxide or silicon nitride having a pattern (openings) which exposes portions of the front side electrodes 10A is formed on the front surface of the resulting wafer W, and bumps 12 are respectively formed on the exposed portions of the front side electrodes 10A as shown in FIG. 13(*a*).

In turn, a base such as a glass plate is bonded onto the front surface of the resulting wafer W via an adhesive tape and, in this state, a rear surface of the wafer W is mechanically polished (ground), whereby the thickness of the wafer W is reduced to about 105 μm. Therefore, the front side recesses 85 do not penetrate through the wafer W at this stage, so that about 35-μm thick wafer portions are present between the front side electrodes 10A and the rear surface of the wafer W as shown in FIG. 13(*b*). Where the wafer W is expected to have a sufficiently high rigidity after the polishing, the polishing of the wafer W may be achieved without the use of the base.

A polishing-damage layer having polishing marks and damaged by the polishing is present in the rear surface of the wafer W. For removal of the polishing-damage layer, the rear surface of the wafer W is dry-etched by about 5 μm (see FIG. 13(*c*)). Thus, the resulting wafer W has a thickness of about 100 μm. At this stage, the front side recesses 85 do not penetrate through the wafer W.

Subsequently, a hard mask 7 of silicon oxide is formed over the rear surface of the wafer W by a CVD method. Then, openings 7*a*, 7*b* are formed in the hard mask 7 by a wet etching process or a dry etching process employing a photoresist. At this time, the openings 7*a* are located in association with the front side recesses 85 as shown in FIG. 13(*d*). This step may be performed, for example, with the wafer W being bonded onto the base employed for the rear surface polishing. In this case, alignment marks for the formation of the openings 7*a*, 7*b* at predetermined positions in the hard mask 7 may be provided on the base.

In turn, rear side recesses 87 and grounding recesses 23 are formed in the rear surface of the wafer W in association with the openings 7*a* and the openings 7*b*, respectively, by a dry etching process employing the hard mask 7 as a mask. The etching process is performed until-the front side seed layers 9 are exposed in the rear side recesses 87. Therefore, the rear side recesses 87 and the grounding recesses 23 each have a depth of about 30 μm. The front side recess 85 and the rear side recess 87 constitute a single through-hole 4 continuously extending generally straight as shown in FIG. 13(*e*).

Subsequently, insulation films of silicon oxide are formed on exposed rear surface portions of the resulting wafer W by a CVD method, and then portions of the insulation films parallel to the wafer W, i.e., portions of the insulation films present on the bottoms of the rear side recesses 87 and the grounding recesses 23, are removed. Thus, a portion of the insulation film present on the inner peripheral surface of each of the rear side recesses 87 and the insulation film 5 present on the inner peripheral surface of each of the front side recesses 85 are unified to constitute an insulation film 5 covering the inner peripheral surface of the through-hole 4. Portions of the insulation films present on side walls of the grounding recesses 23 each serve as an insulation film 24.

In turn, a metal material 89 of copper is filled in the openings 7*a*, 7*b*, the rear side recesses 87 and the grounding recesses 23 of the resulting wafer W by a damascene process. More specifically, barrier metal layers 88 of titanium (Ti) or chromium (Cr) are first formed on the bottoms of the grounding recesses 23, i.e., on exposed surfaces of the wafer W. Thus, the wafer W is covered with the hard mask 7, the insulation films 5, 24 and the barrier metal layers 88 and, therefore, has no exposed surface as shown in FIG. 13(*f*).

Subsequently, a rear side seed layer 14 of copper is formed over the rear surface of the resulting wafer W as shown in FIG. 13(*g*). In FIG. 13(*g*), the barrier metal layer 88 is not shown (and in the subsequent figures).

Further, the metal material 89 of copper is deposited in the openings 7*a*, 7*b*, the rear side recesses 87 and the grounding recesses 23 by a plating process employing the rear side seed layer 14 as a seed (see FIG. 13(*h*)). Thereafter, the rear surface of the resulting wafer W is polished (ground) by a CMP method, whereby the surface of the hard mask 7 becomes flush with the surfaces of the resulting metal material portions 89. The metal material portions 89 present in the rear side recesses 87 and the openings 7*a* each serve as a rear side electrode 10B, and the metal material portions 89 present in the grounding recesses 23 and the openings 7*b* each serve as a ground interconnection 22 as shown in FIG. 13(*i*).

Then, a rear side insulation film 16 of silicon oxide or silicon nitride is formed on the rear surface of the resulting wafer W in a pattern such as to expose the rear side electrodes 10B (see FIG. 13(*j*)), and bumps 15 are respectively formed on the exposed surfaces of the rear side electrodes 10B. Thereafter, the wafer W is diced along scribe lines S by means of a dicing saw 90, whereby semiconductor chips 21 each having the through-electrode 10 as shown in FIG. 2(*a*) are provided (see FIG. 13(*k*)).

In the production method for the semiconductor chip 21, the front side seed layers 9 and the front side electrodes 10A in the front side recesses 85 are not exposed in the step of polishing the rear surface of the wafer W (see FIG. 13(*b*)) and the step of removing the polishing-damage layer (see FIG. 13(*c*)). Therefore, metal (Cu) atoms in the front side seed layers 9 and the front side electrodes 10A are not diffused into the wafer W. Hence, the semiconductor substrates 2 of the semiconductor chips 21 thus produced are less susceptible to metal contamination.

The front side recesses 85 formed from the front surface of the wafer W are not allowed to penetrate through the wafer W by polishing the entire rear surface of the wafer W, but are allowed to penetrate through the wafer W by forming the rear side recesses 87 in the predetermined portions of the rear surface of the wafer W. Therefore, the semiconductor substrate 2 has a maximum thickness of about 100 μm.

The rear surface of the wafer W may be formed with the rear side recesses 87 alone without the grounding recesses 23. In this case, semiconductor chips 1 as shown in FIG. 1 are provided. Instead of the rear side recesses 87, the grounding recesses 23 maybe formed as communicating with the front side recesses 85. In this case, semiconductor chips 33 as shown in FIG. 2(*c*) are provided.

Instead of the rear side recesses 87, rear side recesses or grounding recesses 29 maybe formed as extending across the scribe lines S. In this case, semiconductor chips 26, 34 (see FIGS. 2(*b*) and 2(*d*)) whose rear side electrodes 10B or ground interconnections 27 are exposed to the end faces thereof are provided when the wafer W is diced along the scribe lines S.

Power supply recesses 64 communicating with the front side recesses 85 may be formed instead of the rear side recesses 87, and rear side seed layers 28 maybe formed instead of the rear side seed layers 14. In this case, semiconductor chips 63 as shown in FIG. 9 are provided. In this case, insulation films 66 may be formed on the rear surface of the semiconductor substrate 2 before the formation of the rear side seed layers 28. The semiconductor chips 63 may be of a SOI (silicon on insulator) type, in which an insulation film intervenes between the semiconductor substrate 2 and the functional device 3. In this case, the step of forming the insulation films 66 may be obviated.

After the formation of the front side insulation film 13, dummy bumps 42 or dummy patterns 52 may be formed in addition to the bumps 13. After the formation of the rear side insulation film 16 having a pattern such as to expose predetermined portions of the ground interconnections 22, 27, dummy bumps 43 or dummy patterns 53 may be formed in addition to the bumps 15, 31. By these methods, semiconductor chips 41, 44, 45, 46, 51, 54, 55, 56 and 61 as shown in FIGS. 6(a) to 6(d), 7(a) to 7(d) and 8 are provided.

Next, a production method for the semiconductor device 71 will be described by way of example for explanation of a semiconductor device production method employing semiconductor chips 1, 21, 26, 33, 34, 41, 44, 45, 46, 51, 54, 55, 56, 61 or 63. First, a semiconductor chip 21 is bonded onto the surface of a wiring board 72 (see FIG. 3) formed with an interconnection 73 with the rear surface thereof being opposed to the surface of the wiring board 72. At this time, the bump 15 of the semiconductor chip 21 is connected to the bump 77 of the wiring board 72.

More specifically, the semiconductor chip 21 is held by sucking the front surface of the semiconductor chip 21 by a suction collet of a flip-chip bonder, and pressed against the wiring board 72 thereby to be bonded onto the wiring board 72. Before the bonding of the semiconductor chip 21, a recognition camera is inserted between the wiring board 72 and the semiconductor chip 21 for positioning the semiconductor chip 21 with respect to the wiring board 72. The positioning is achieved by utilizing positioning marks preliminarily formed on the wiring board 72 and the semiconductor chip 21.

The semiconductor chip 21 may be bonded onto the wiring board 72 with the front surface thereof being opposed to the wiring board 72. In this case, the rear surface of the semiconductor chip 21 not formed with the functional device 3 is sucked and pressed by the suction collet. In this case, the positioning marks can be formed by a highly accurate wiring process which is useful for the formation of the functional device 3. In the aforesaid case, the semiconductor device is produced as having the semiconductor chips 21 whose front surfaces face toward the wiring board 72.

Then, the bump 15 of another semiconductor chip 21 is connected to the bump 12 of the semiconductor chip 21. In this manner, the semiconductor chips 21 are sequentially stacked. At this time, the semiconductor chips 21 can properly be connected to one another or to the wiring board 72 without warp, because the semiconductor chips 21 each have a thickness of about 100 μm and a sufficiently high rigidity.

Further, the semiconductor chips 21 and the surface of the wiring board 72 formed with the interconnection 73 are sealed with a resin sealing 76 by injection molding. Thus, the semiconductor device 71 shown in FIG. 3 is provided.

The semiconductor chips 21 may sequentially be stacked and bonded (on a chip-on-chip basis) on a semiconductor substrate 92 (see FIG. 11) rather than on the wiring board 72. In this case, the semiconductor substrate 92 is die-bonded onto a BGA board 72A, and then the module 93, the semiconductor substrate 92, the bonding wire 97 and a surface of the BGA board 72A formed with interconnections 73A are sealed with a resin sealing 76A. Thus, the semiconductor device 91 shown in FIG. 11 is provided.

Alternatively, semiconductor chips 21 may sequentially be stacked and bonded (on a chip-on-wafer basis) on plural semiconductor substrate regions densely defined on a wafer rather than on individual semiconductor substrates 92. In this case, the resulting wafer is thereafter diced into individual semiconductor substrates 92. In either of these cases, the respective semiconductor chips 21 are disposed exactly parallel to the semiconductor substrate 92 in the semiconductor device 91 thus produced.

Alternatively, the semiconductor chips 21 may sequentially be stacked and bonded onto a semiconductor substrate 92 preliminarily die-bonded onto a BGA board 72A (or onto a lead frame if a semiconductor device of a QFP type or a like package type is produced). In this case, a BGA board 72A or a lead frame on which a plurality of semiconductor substrates 92 are bonded may be prepared, and the semiconductor substrates 92 on the BGA board 72A or the lead frame may sequentially be transported on a transport rail to a semiconductor chip bonding position to bond the semiconductor chips 21 thereto.

Next, an explanation will be given to a production method for the semiconductor device 98 shown in FIG. 12. FIGS. 14(a) to 14(h) are schematic sectional views for explaining a first production method for the semiconductor device 98.

First, a multiplicity of semiconductor substrate regions are densely defined on a wafer W. Functional devices 95 are formed in the wafer W, and bumps 96b are formed on the wafer W. Then, a seed layer 78 is formed over a surface of the wafer W formed with the functional devices 95 by a sputtering method or the like (see FIG. 14(a)). In turn, a photoresist film 79 is formed on the seed layer 78, and then openings 79a are formed in predetermined portions of the photoresist film 79 corresponding to post electrodes 99 (see FIG. 12) by exposure and development. The photoresist film 79 has a generally flat surface, and portions of the seed layer 78 are exposed in the bottoms of the openings 79a as shown in FIG. 14(b).

Then, the post electrodes 99 are formed in the openings 79a by performing an electrolytic plating process employing the seed layer 78 as a seed in an electrolytic plating bath. At this time, the post electrodes 99 grow from the side of the seed layer 78. The plating process is finished before the openings 79a are completely filled with the post electrodes 99, as shown in FIG. 14(c).

Thereafter, the photoresist film 79 is removed. Thus, the post electrodes 99 are provided as projecting upright from the surface of the wafer W (see FIG. 14(d)).

Figure 14E:
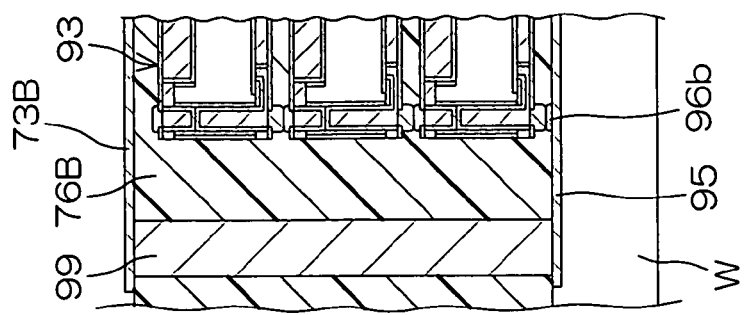
Figure 14F:
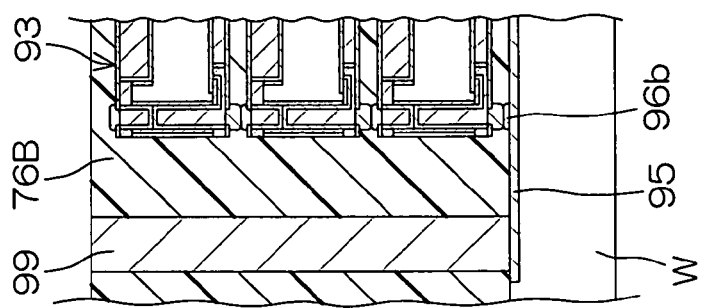

After an exposed portion of the seed layer 78 is removed, semiconductor chips 21 are stacked on the wafer W to provide modules 93. At this time, the bumps 96b of the wafer W are connected to the bumps 12 of the semiconductor chips 21 first stacked on the wafer W as shown in FIG. 14(e). In turn, the modules 93, the post electrodes 99 and the surface of the wafer W formed with the functional devices 95 are sealed with a resin sealing 76B. The resin sealing 76B has a thickness such as to cover distal ends of the post electrodes 99, and has a generally flat surface as shown in FIG. 14(f).

Figure 14G:
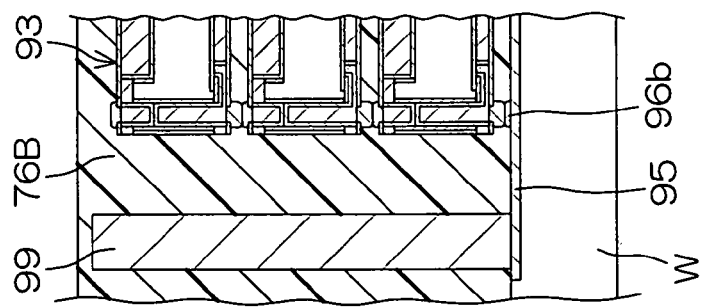
Figure 14H:
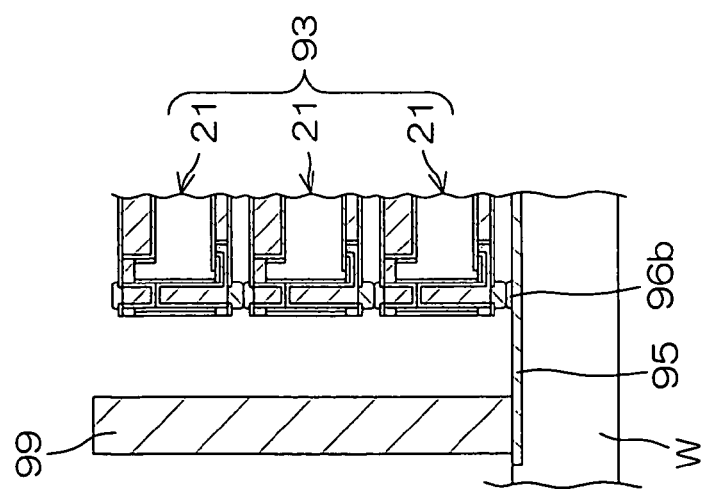
Figure 17A:
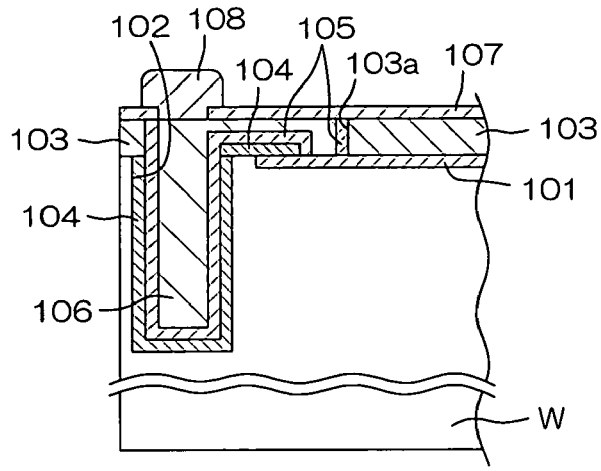
FIGS. 17(a) to 17(f) are schematic sectional views for explaining a first conventional production method for a semiconductor chip having a through-electrode.
Figure 17B:
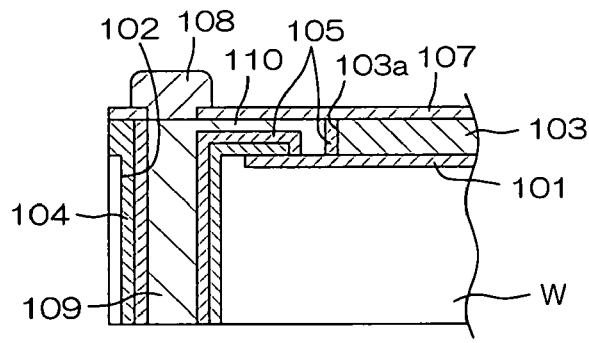
Figure 17C:
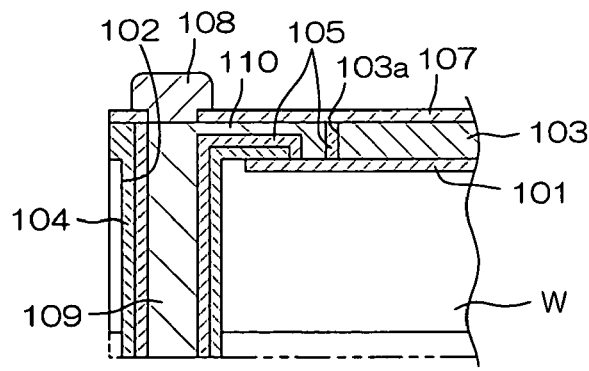
Figure 17D:
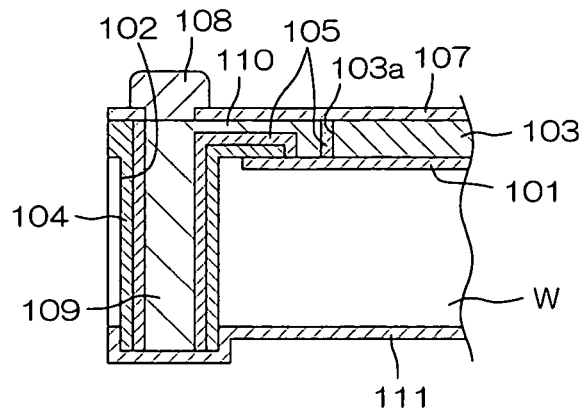
Figure 17E:
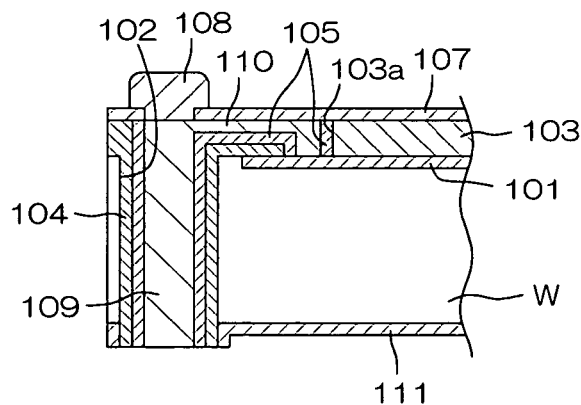
Figure 17F:
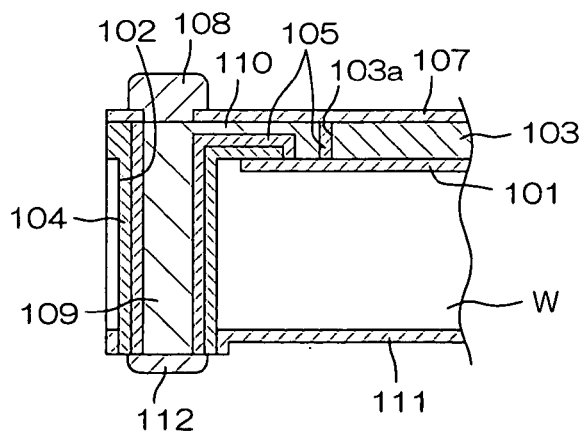
Figure 18A:
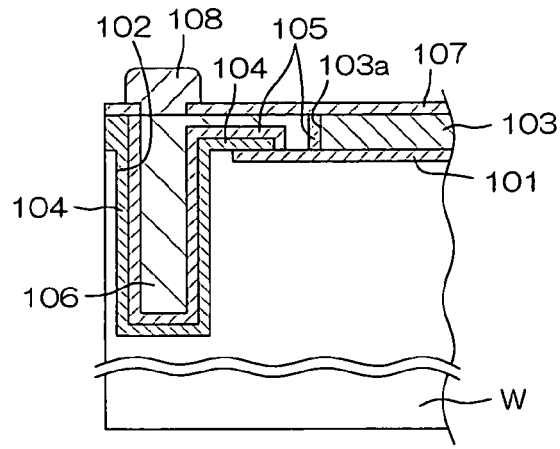
FIGS. 18(a) to 18(f) are schematic sectional views for explaining a second conventional production method for a semiconductor chip having a through-electrode.
Figure 18B:
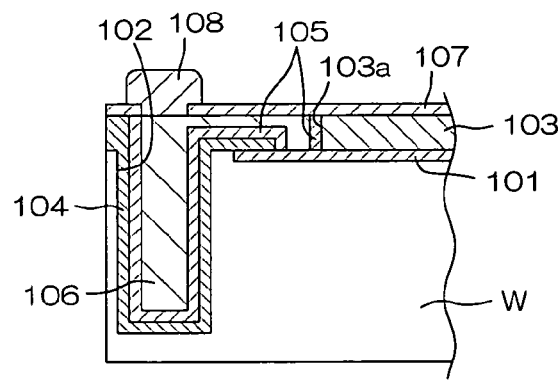
Figure 18C:
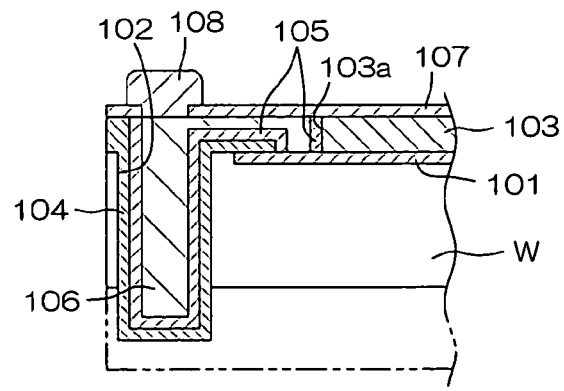
Figure 18D:
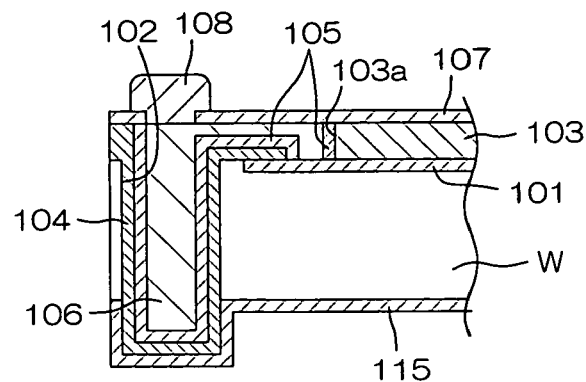
Figure 18E:
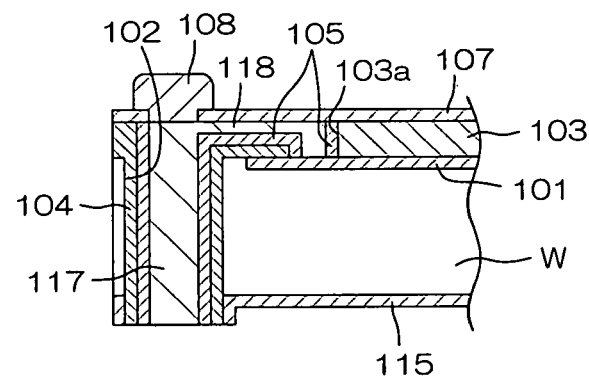
Figure 18F:
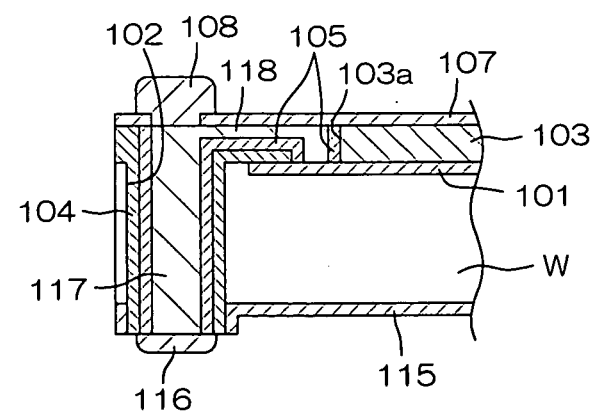

In turn, the surface of the resin sealing 76B is polished to expose the distal ends of the post electrodes 99 (see FIG. 14(g)). This step may be performed by a mechanical polishing method or a CMP method. Then, re-interconnections 73B are formed on the surface of the resin sealing 76B so as to be respectively connected to the post electrodes 99 as shown in FIG. 14(h). Thereafter, solder balls 75B are bonded onto predetermined portions of the re-interconnections 73B. Together with the resin sealing 76B, the wafer W is diced into individual semiconductor substrates 92. Thus, semiconductor devices 98 as shown in FIG. 12 are provided.

According to this semiconductor device production method, the stacking of the semiconductor chips 21, the formation of the post electrodes 99 and the re-interconnections 73B and the formation of the resin sealing 76B are carried out on a wafer-level basis.

FIGS. 15(a) to 15(e) are schematic sectional views for explaining a second production method for the semiconductor device 98.

First, semiconductor chips 21 are stacked on a surface of a wafer W having plural semiconductor substrate regions densely defined thereon and respectively formed with functional devices 95 to provide modules 93 on the wafer W. At this time, bumps 96b formed on the wafer W are respectively connected to the bumps 12 of the semiconductor chips 21 first stacked on the wafer W as shown in FIG. 15(a).

In turn, a photoresist film 79B is formed on the module 93 and the surface of the wafer W formed with the functional devices 95. The photoresist film 79B has a thickness such as to completely cover the modules 93, and has a generally flat surface. Then, openings 79c are formed in predetermined portions of the photoresist film 79B corresponding to post electrodes 99 (see FIG. 12) as shown in FIG. 15(b) by exposure and development. Electrodes formed on the functional devices 95 are exposed in the bottoms of the openings 79c.

Subsequently, a seed layer 78A is formed on the surface of the photoresist film 79B and on interior surfaces of the openings 79c, for example, by a sputtering method or the like (see FIG. 15(c)). Further, a metal material 80 is deposited on the surface of the photoresist film 79B and in the openings 79c by an electrolytic plating process employing the seed layer 78A as a seed. The openings 79c are completely filled with the metal material 80 as shown in FIG. 15(d). In FIG. 15(d), the seed layer 78A is not shown (and in the subsequent figure).

In turn, a portion of the metal material 80 deposited on the surface of the photoresist film 79B is polished away, whereby the surfaces of the resulting metal material portions 80 present in the openings 79c become flush with the surface of the photoresist film 79B. The metal material portions 80 in the openings 79c serve as the post electrodes 99 as shown in FIG. 15(e).

After the photoresist film 79B is removed, the step of forming the resin sealing 76B and the steps subsequent thereto (see FIGS. 14(f) to 14(h)) are performed in the same manner as in the first semiconductor device production method. Thus, semiconductor devices 98 are provided.

Where the seed layer 78A can be formed in a sufficiently great thickness in the aforesaid production method, the formation of the post electrodes 99 may be achieved by completely filling the openings 79c with the seed layer 78A.

FIGS. 16(a) to 16(d) are schematic sectional views for explaining a production method for a semiconductor device similar in construction to the semiconductor device 98.

This semiconductor device production method is substantially the same as the second production method for the semiconductor device 98, except that a resin sealing 76B is formed instead of the photoresist film 79B having the openings 79c (see FIG. 15(b)) and openings 76d are formed in predetermined portions of the resin sealing 76B corresponding to the post electrodes 99 (see FIG. 12). Where the resin sealing 76B is composed of a photosensitive resin, the formation of the openings 76d may be achieved by exposure and development. Where the resin sealing 76B is composed of a non-photosensitive resin, the formation of the openings 76d may be achieved, for example, by etching.

In turn, an interconnection layer 78B is formed on the entire surface of the resin sealing 76B and on interior surfaces of the openings 76d, for example, by a sputtering method or the like. The interconnection layer 78B has a smaller thickness so as not to completely fill the openings 76d as shown in FIG. 16(a).

Subsequently, the openings 76d are filled with a resin 76C (see FIG. 16(b)). This step is optional, and the openings 76d may be left unfilled.

Then, a portion of the interconnection layer 78B present on the resin sealing 76B (outside the openings 76d) is patterned by a lithography method for formation of re-interconnections 73B. Portions of the interconnection layer 78B present in the openings 76d each serve as a through-hole interconnection 99T which electrically connects the electrode of the functional device 95 to the re-interconnection 73B as shown in FIG. 16(c).

Thereafter, the step of bonding the solder balls 75B (see FIG. 16(d)) and the steps subsequent thereto are performed in the same manner as in the first production method for the semiconductor device 98. Thus, semiconductor devices each having substantially the same construction as the semiconductor device 98 are provided.

While the embodiments of the present invention have thus been described, the invention may be embodied in any other ways. For example, the step of polishing the rear surface of the wafer W (see FIG. 13(b)) and the step of removing the polishing-damage layer (see FIG. 13(c)) may be performed so as to allow a remaining portion of the wafer W to have a greater thickness. For example, the remaining portion of the wafer W may have a thickness of about 140 µm. In this case, the rear side recesses 87 can be formed in the rear surface of the wafer W, for example, as having a width and length of about 10 µm and a depth of about 70 µm as measured from the rear surface of the wafer W for the formation of the through-holes 4.

The metal material 86 and the metal material 89 may be, for example, aluminum (Al), tungsten (W), chromium, titanium, gold (Au), indium (In) or a tin (Sn)-based solder. That is, the front side electrodes 10A, the interconnection members 11, the rear side electrodes 10B and the ground interconnections 22, 27 may be composed of aluminum, tungsten, chromium, titanium, gold, indium or a tin-based solder.

Figure 13B:
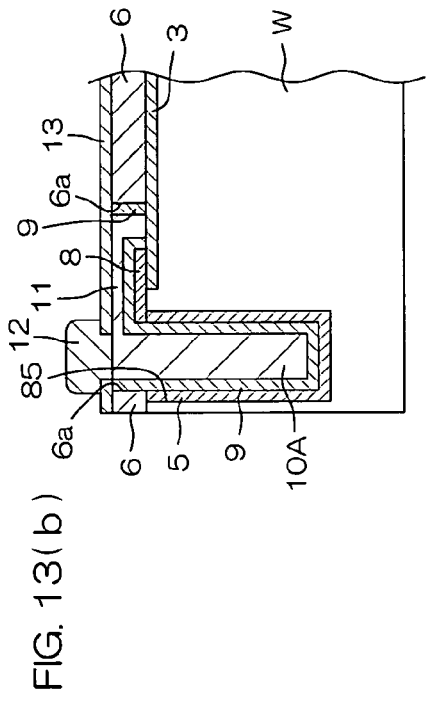
FIGS. 13(a) to 13(k) are schematic sectional views for explaining a production method for the semiconductor chip shown in FIG. 2(a)
Figure 13D:
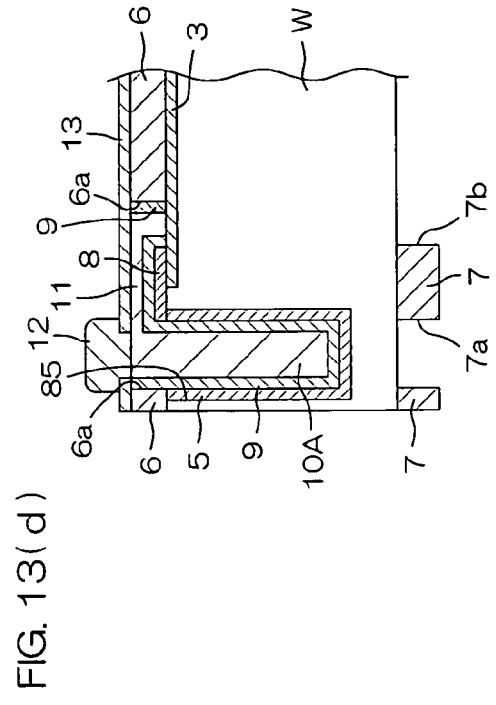
Figure 13A:
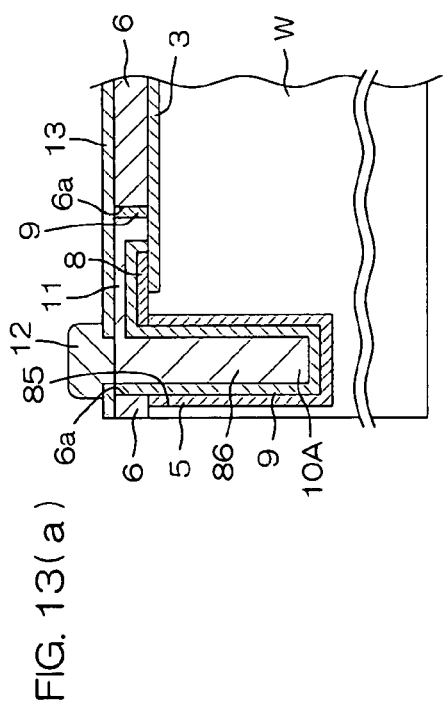
Figure 13C:
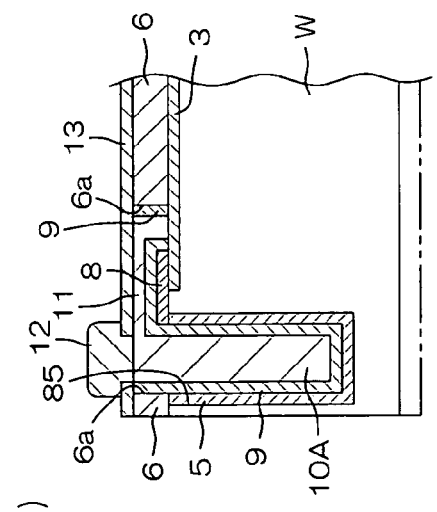
Figure 13E:
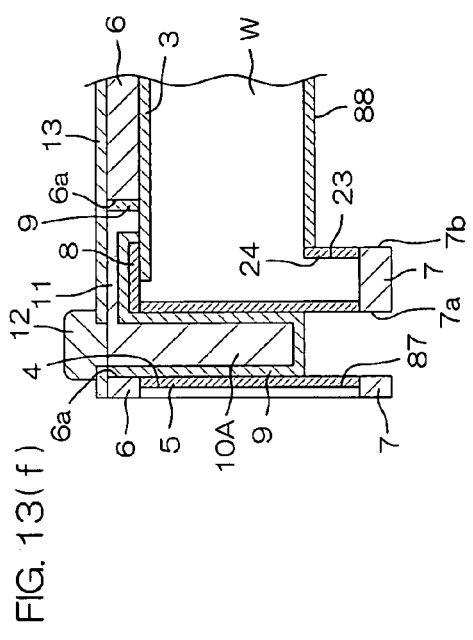
Figure 13G:
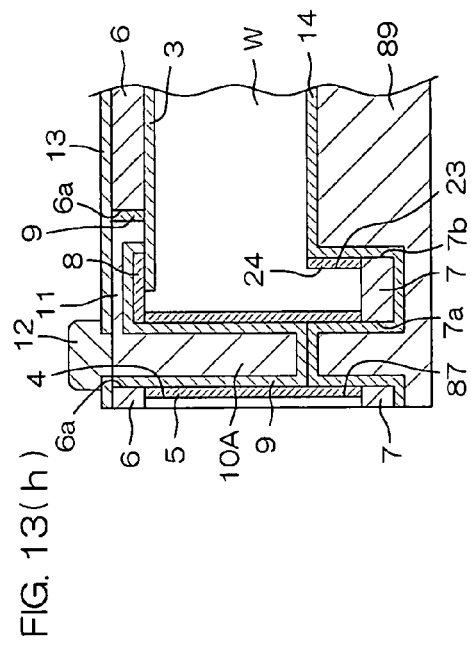
Figure 13F:
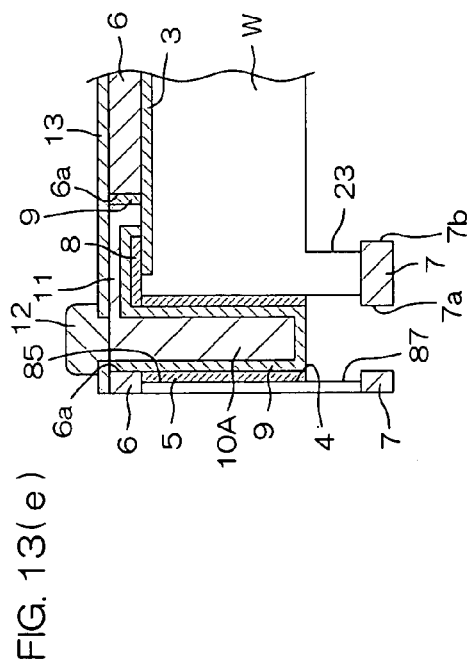
Figure 13H:
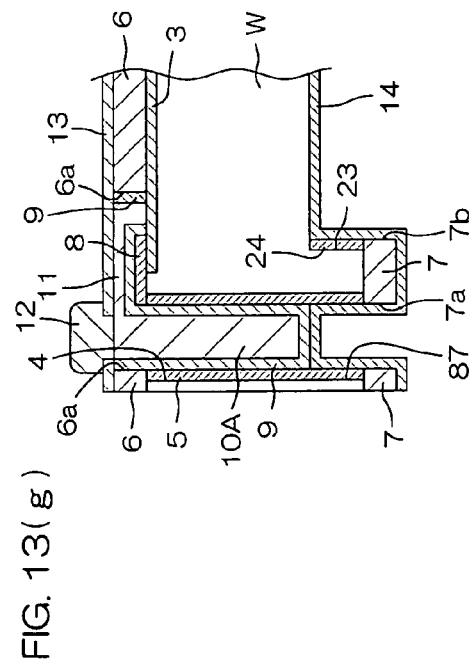
Figures 13I, 13J, 13K:
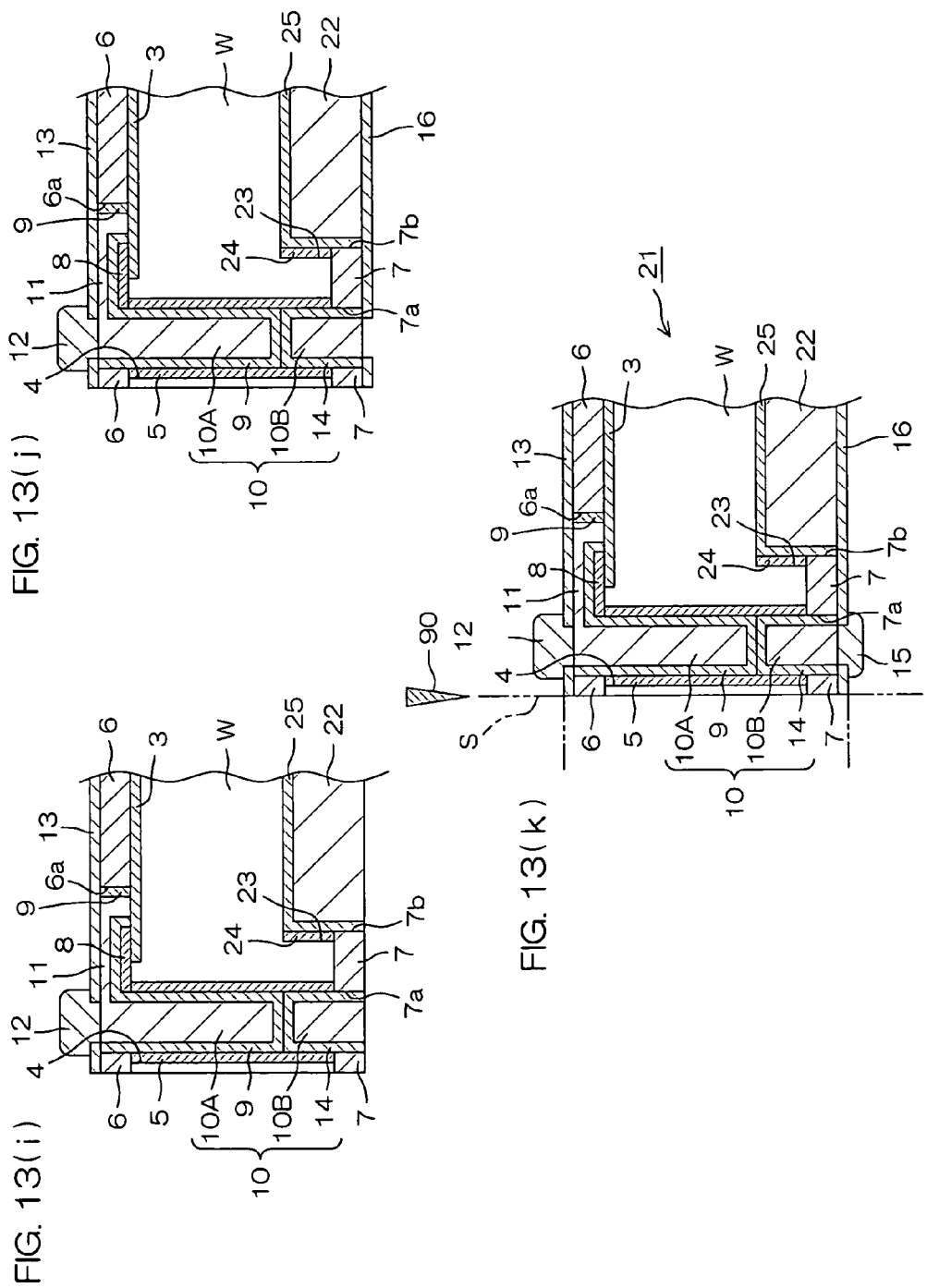

The step of filling the metal material 86 in the openings 6a and the front side recesses 85 (see FIG. 13(a)) and the step of filling the metal material 89 in the openings 7a, 7b, the rear side recesses 87 and the grounding recesses 23, 29 (see FIGS. 13(h) and 13(i)) may employ a CVD method, a sputtering method, a dipping method utilizing a melted material, or the like. In these cases, the step of forming the front side seed layers 9 and the step of forming the rear side seed layers 14, 25, 28 may be obviated.

The step of forming the rear side recesses may include the step of forming the grounding recesses 23, 29 and the power supply recesses 64 in the rear surface of the semiconductor chip. In this case, a semiconductor chip having both the ground interconnection 22, 27 and the power supply interconnection 65 provided in a rear surface thereof is produced.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-134810 filed with the Japanese Patent Office on May 13, 2003, the disclosure thereof being incorporated herein by reference.

What is claimed is:

1. A semiconductor chip production method, comprising the steps of:

forming a front side recess in a semiconductor substrate having a front surface and a rear surface and including a functional device provided in the front surface thereof, the front side recess extending from the front surface of the semiconductor substrate along a thickness of the semiconductor substrate;

depositing a metal material in the front side recess to form a front side electrode electrically connected to the functional device;

removing a rear surface portion of the semiconductor substrate to reduce the thickness of the semiconductor substrate to a predetermined thickness which is greater than a depth of the front side recess;

forming a rear side recess communicating with the front side recess in the rear surface of the semiconductor substrate after the thickness reducing step to form a continuous through-hole; and depositing a metal material in the rear side recess to form a rear side electrode electrically connected to the front side electrode for formation of a through-electrode extending through the semiconductor substrate.

2. A semiconductor chip production method as set forth in claim 1, wherein the rear side recess forming step includes the step of forming a grounding recess in which a ground interconnection is formed, wherein the rear side electrode forming step includes the step of depositing the metal material in the grounding recess to form the ground interconnection.

3. A semiconductor chip production method as set forth in claim 1, wherein the rear side recess forming step includes the step of forming a power supply recess in which a power supply interconnection is formed, wherein the rear side electrode forming step includes the step of depositing the metal material in the power supply recess to form the power supply interconnection.

4. A semiconductor chip production method as set forth in claim 1, further comprising the step of exposing a part of the metal material deposited in the rear side recess to an end face of the semiconductor chip.

5. A semiconductor chip production method as set forth in claim 1, wherein at least one of the front side electrode forming step and the rear side electrode forming step includes the steps of:

forming a seed layer on an interior surface of the recess; and depositing the metal material on an interior surface of the recess by a plating process employing the seed layer as a seed to form the electrode.

6. A semiconductor chip production method as set forth in claim 1, wherein the thickness reducing step includes the steps of:

physically polishing the rear surface of the semiconductor substrate; and after the polishing step, removing a polishing-damage layer which occurs in the rear surface portion of the semiconductor substrate during the polishing step.

7. A semiconductor device production method, comprising the steps of:

producing each of plural semiconductor chips; and stacking the plural semiconductor chips one on another, wherein the semiconductor chip producing step includes the steps of:

forming a front side recess in a semiconductor substrate having a front surface and a rear surface and including a functional device provided in the front surface thereof, the front side recess extending from the front surface of the semiconductor substrate along a thickness of the semiconductor substrate;

depositing a metal material in the front side recess to form a front side electrode electrically connected to the functional device;

removing a rear surface portion of the semiconductor substrate to reduce the thickness of the semiconductor substrate to a predetermined thickness which is greater than a depth of the front side recess;

forming a rear side recess communicating with the front side recess in the rear surface of the semiconductor substrate after the thickness reducing step to form a continuous through-hole; and depositing a metal material in the rear side recess to form a rear side electrode electrically connected to the front side electrode for formation of a through-electrode extending through the semiconductor substrate.

8. A semiconductor device production method as set forth in claim 7, wherein the semiconductor chip producing step further includes the step of forming a bump electrically connected to the through-electrode on at least one of the front and rear surfaces of the semiconductor substrate, wherein the semiconductor chip stacking step includes the step of connecting the bump formed on one of the semiconductor chips to the bump formed on another of the semiconductor chips.

* * * * *

UNITED STATES PATENT AND TRADEMARK OFFICE
CERTIFICATE OF CORRECTION

| | |
|---|---|
| PATENT NO. | : 7,122,457 B2 |
| APPLICATION NO. | : 10/840677 |
| DATED | : October 17, 2006 |
| INVENTOR(S) | : Kazumasa Tanida et al. |

It is certified that error appears in the above-identified patent and that said Letters Patent is hereby corrected as shown below:

<u>Title Page, Item 73 (Assignee)</u>

Please change the listing of Assignees to read as follows:

-- Rohm Co., Ltd. (Kyoto, JP)
Renesas Technology Corporation (Tokyo, JP) --

Signed and Sealed this

Thirteenth Day of March, 2007

JON W. DUDAS
*Director of the United States Patent and Trademark Office*